(12) United States Patent
Arai et al.

(10) Patent No.: US 7,626,744 B2
(45) Date of Patent: Dec. 1, 2009

(54) OPTICAL SCANNING DEVICE AND IMAGE FORMING APPARATUS

(75) Inventors: Nobuyuki Arai, Kanagawa (JP);
Yoshinori Hayashi, Kanagawa (JP);
Daisuke Ichii, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 0 days.

(21) Appl. No.: 12/031,362

(22) Filed: Feb. 14, 2008

(65) Prior Publication Data
US 2008/0204842 A1 Aug. 28, 2008

(30) Foreign Application Priority Data

| Feb. 27, 2007 | (JP) | ............................. 2007-046442 |
| Feb. 27, 2007 | (JP) | ............................. 2007-046451 |
| Feb. 28, 2007 | (JP) | ............................. 2007-048209 |

(51) Int. Cl.
*G02B 26/08* (2006.01)
(52) U.S. Cl. .................................................. 359/204.1
(58) Field of Classification Search ................. 359/204, 359/204.1, 204.2; 347/130, 225, 233
See application file for complete search history.

(56) References Cited

U.S. PATENT DOCUMENTS

| 6,462,853 | B2 | 10/2002 | Hayashi |
| 6,788,444 | B2 | 9/2004 | Suzuki et al. |
| 7,068,296 | B2 | 6/2006 | Hayashi et al. |
| 7,106,483 | B2 | 9/2006 | Hayashi et al. |
| 7,218,432 | B2 | 5/2007 | Ichii et al. |
| 7,253,937 | B2 | 8/2007 | Ueda et al. |
| 7,271,823 | B2 | 9/2007 | Izumi et al. |
| 7,271,824 | B2 | 9/2007 | Omori et al. |
| 2003/0086142 | A1* | 5/2003 | Akatsu et al. ................ 359/204 |
| 2006/0077500 | A1 | 4/2006 | Hayashi et al. |
| 2006/0232659 | A1 | 10/2006 | Hayashi et al. |
| 2006/0245009 | A1 | 11/2006 | Akiyama et al. |
| 2006/0284968 | A1 | 12/2006 | Hayashi et al. |
| 2007/0058255 | A1 | 3/2007 | Imai et al. |
| 2007/0211324 | A1 | 9/2007 | Sakai et al. |
| 2007/0211325 | A1 | 9/2007 | Ichii |

(Continued)

FOREIGN PATENT DOCUMENTS

JP 11-340570 12/1999

(Continued)

OTHER PUBLICATIONS

U.S. Appl. No. 12/186,808, filed Aug. 6, 2008, Watanabe, et al.

(Continued)

*Primary Examiner*—Euncha P Cherry
(74) *Attorney, Agent, or Firm*—Oblon, Spivak, McClelland, Maier & Neustadt, L.L.P.

(57) ABSTRACT

By setting elements within the range that predetermined conditions are satisfied, for example, so that a size of a rotating polygon mirror is minimized, the rotating polygon mirror is made compact while the eclipse of light beams in the main scanning direction is prevented. The cost reduction of an apparatus is thus realized. The compact rotating polygon mirror reduces the consumption energy and the amount of heat generated in its drive system. Deteriorations in various optical characteristics including an increase in spot diameter of the light beam by temperature variation, uneven scanning pitch, and sub-scanning direction variation in beam pitch are suppressed.

20 Claims, 23 Drawing Sheets

U.S. PATENT DOCUMENTS

2007/0253047 A1 11/2007 Ichii et al.
2007/0253048 A1 11/2007 Sakai et al.
2007/0297036 A1 12/2007 Nakamura et al.

FOREIGN PATENT DOCUMENTS

| | | |
|---|---|---|
| JP | 11-354888 | 12/1999 |
| JP | 2004-126192 | 4/2004 |
| JP | 2004-287292 | 10/2004 |
| JP | 2005-250319 | 9/2005 |
| JP | 2005-309301 | 11/2005 |

OTHER PUBLICATIONS

U.S. Appl. No. 12/190,182, filed Aug. 12, 2008, Ichii et al.

* cited by examiner

OPTICAL SCANNING DEVICE AND IMAGE FORMING APPARATUS

CROSS-REFERENCE TO RELATED APPLICATIONS

The present application claims priority to and incorporates by reference the entire contents of Japanese priority documents 2007-048209 filed in Japan on Feb. 28, 2007, 2007-046451 filed in Japan on Feb. 27, 2007 and 2007-046442 filed in Japan on Feb. 27, 2007.

BACKGROUND OF THE INVENTION

1. Field of the Invention

The present invention relates to an optical scanning device and an image forming apparatus.

2. Description of the Related Art

In current optical scanning devices and image forming apparatuses using such optical scanning devices, high quality images, full color images, high image forming speeds, and cost reductions in apparatuses have been demanded. To accomplish high quality images, curvature of scanning lines and variation in beam spot diameter on a scanned surface needs to be reduced. Moreover, position shifts of beam spots due to improvement in constant speed characteristic needs to be reduced.

To accomplish high image forming speed, optical scanning devices that can scan a scanned surface with a plurality of light beams at the same time need to be realized. In recent years, multibeam image forming apparatuses that can perform scanning with a plurality of scanning lines at a time have appeared. According to such image forming apparatuses, light sources irradiating light beams are spaced apart from each other by a distance in a sub-scanning direction. The configuration of the curvature then varies from one scanning line to another and the image quality is thus deteriorated.

Particularly, in full color image forming apparatuses that scanned surfaces for a plurality of colors are scanned by respective scanning optical systems and toner images corresponding to the respective colors are superimposed, for example, in tandem image forming apparatuses, the image quality can be deteriorated because of color shifts in the sub-scanning direction and differences in shading.

A vertical resonator surface emitting laser (hereinafter, VCSEL) that a plurality of emission points irradiating light beams are formed easily on one element is particularly effective for multibeam. As the number of beams is increased, however, a region where emission points are arranged becomes large around the optical axis and the aforementioned problems become more serious. Specifically, the position on an optical element through which the light beam passes is different from channel to channel because of a large number of the emission points and the difference in optical characteristics between the channels becomes large. A beam spot diameter can be increased in a main scanning direction or sub-scanning direction. A scanning pitch can become uneven and a beam pitch in the sub-scanning direction can be increased.

Although excellent images are provided during ordinary use, because of environmental changes including changes in room temperature and temperature rises within apparatuses caused by continuous prints, the arrangement and configuration of optical elements in such apparatus can be changed slightly, the path of light beam is varied, and a sub-scanning direction distance between the light beams is varied. As a result, the color shift occurs in the resulting output image.

Such color shift caused by the environmental changes is serious in image forming apparatuses with advanced high density and high image quality, particularly in color image forming apparatuses and measures needs to be taken. To solve these problems, techniques described in, for example, Japanese Patent Application Laid-open No. 2004-287292 and Japanese Patent Application Laid-open No. 2005-309301 have been proposed.

According to an image forming apparatus using VCSEL described in Japanese Patent Application Laid-open No. 2004-287292, a distance between light sources spaced farthest apart from each other in the main scanning direction is smaller than a distance between light sources spaced farthest apart from each other in the sub-scanning direction. All conditions including cost reduction in the apparatus, significantly high density image, and ensuring of light amount of light beam are thus difficult to be satisfied.

According to an image forming apparatus described in Japanese Patent Application Laid-open No. 2005-309301, in a multibeam scanning optical system, skew and sub-scanning direction angle are adjusted for a plurality of cylindrical mirrors, so that the curvature of scanning lines is adjusted. High quality images are thus obtained. Because cylindrical mirrors are expensive, however, the cost reduction of the apparatus is limited.

Furthermore, the above patent documents do not describe any appropriate distance between emission points on a surface emitting laser light source that irradiates a plurality of light beams from two-dimensionally arranged emission points and the conditions of the scanning optical system for the surface emitting laser. Means for solving the problems such as a decrease in scanning speed caused by the lack of light amount during scanning, increased cost because expensive optical elements is utilized, and an increase in the beam spot diameter are not described. High quality images, increased image forming speeds, and cost reductions in apparatuses have not been realized.

Japanese Patent Application Laid-open No. H11-340570 discloses a photoelectric conversion element that includes a plurality of photoelectric conversion units on the same substrate. The photoelectric conversion unit is formed of a plurality of semiconductor layers laminated and its side surface is at the end portion in a direction vertical to the laminated direction.

Japanese Patent Application Laid-open No. H11-354888 discloses a semiconductor emission element including a base, a substrate supported by the base, a plurality of light emitting units formed of a plurality of semiconductor layers laminated on the side of the substrate opposite the side at which the base is placed, a plurality of ohmic electrodes that are provided on the side of the light emitting units opposite the side at which the substrate is provided and electrically connected to the respective light emitting units, and at least one radiation layer that is laminated via the light emitting units on the substrate to be formed at the side of the light emitting units opposite the side at which the substrate is placed.

However, the photoelectric conversion element disclosed in Japanese Patent Application Laid-open No. H11-340570 and the semiconductor emission element disclosed in Japanese Patent Application Laid-open No. H11-354888 have large consumption power and amount of heat generated, so that they cannot be utilized in multibeam light sources. In view of costs, they can be utilized in four- or eight-beam light sources at most. According to these elements, a plurality of light emitting units are arranged one-dimensionally. If the number of beams is substantially increased, the amount of beam shift from the optical axis of the optical system becomes large, so that beam characteristics can be deteriorated.

Meanwhile, a vertical resonator surface emitting laser (VCSEL: Vertical Cavity Surface Emitting Laser) that can form a plurality of emission points two-dimensionally on a device and has small consumption power has been proposed.

Japanese Patent Application Laid-open No. 2004-287292 discloses an optical scanning device that includes a first substrate to which the light emitting element and its drive circuit are mounted and which is incorporated in a housing fixed to the image forming apparatus main unit, a second substrate to which the connector for connecting to the harness from the image forming apparatus main unit is mounted and which is incorporated in the housing to be apart from the first substrate, and a connecting member for electrically connecting a terminal of the first substrate to the terminal of the second substrate.

Japanese Patent Application Laid-open No. 2005-250319 discloses a light source apparatus including a plurality of combinations of the light source obtained by arranging a plurality of independently modulated emission points two-dimensionally and the coupling lens that couples divergent light irradiated from the light source.

Japanese Patent Application Laid-open No. 2005-309301 discloses an optical scanning device that includes a light source for irradiating light beam, a deflector for deflecting the light beam in the main scanning direction, an optical system for imaging the deflected light beam on a scanned surface, and a plurality of cylindrical mirrors placed on the optical path between the deflector and the scanned surface. The optical scanning device includes a skew adjustment unit that rotates a cylindrical mirror adjacent to the scanned surface about the normal line of the reflecting surface to adjust the skew of scanning lines and an angle adjustment unit that rotates the cylindrical mirror adjacent to the deflector about the generatrix of the reflecting surface to adjust the sub-scanning direction angle.

The image forming apparatus has recently been used for simplified printing as an on-demand printing system. Accordingly, higher image qualities have been demanded without increasing its price.

SUMMARY OF THE INVENTION

It is an object of the present invention to at least partially solve the problems in the conventional technology.

According to an aspect of the present invention, there is provided an optical scanning device that scans a writing area on a scan-target surface with a plurality of light beams in a main scanning direction. The optical scanning device includes a light source including a plurality of light emission outlets arranged two-dimensionally; a first optical system including a coupling lens for coupling light beams output from the light emission outlets; an aperture member having an opening and placed at or near the focal position of the coupling lens; a rotating polygon mirror including a plurality of deflecting surfaces, each of the deflecting surfaces deflecting light beams that have passed through the opening in the aperture member; and a second optical system that collects the light beams deflected by the rotating polygon mirror on the writing area on the scan-target surface. When W is a distance between, among the light emission outlets, light emission outlets spaced farthest apart from each other in the main scanning direction, E is a dimension of the opening of the aperture in the main scanning direction, Rc is the radius of a circle inscribing the rotating polygon mirror, M is number of deflecting surfaces of the rotating polygon mirror, a is an angle of incidence of the light beams on the deflecting surfaces, f is an angle of view of the second optical system from start to end of scanning on the writing area, x is a distance between the aperture member and the rotating polygon mirror, and $f_1$ is a focal length of the coupling lens, then $$2Rc \times \tan\left(\frac{\pi}{M}\right) \times \cos\left(\frac{\alpha + \varphi/4}{2}\right) - E - W \times \frac{x}{f_1} - Rc \times \sin\frac{\phi}{2}\cos\frac{\alpha}{2} > 0.$$

According to another aspect of the present invention, there is provided an optical scanning device for scanning a scan-target surface with light. The optical scanning device includes a light source including a plurality of light emitting units arranged two-dimensionally; a deflector that deflects light beams output from the light emitting units of the light source; and a scanning optical system that collects light beams deflected by the deflector on the scan-target surface. A distance between two light emitting units that are most adjacent to each other in a sub-scanning direction is larger than 1 micrometer and smaller than 5 micrometers.

According to still another aspect of the present invention, there is provided an optical scanning device comprising a plurality of light emitting units. A distance between two adjacent light emitting units in a sub-scanning direction is equal to or larger than 1 micrometer and smaller than 4 micrometers.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention will be described below in detail with reference to the accompanying drawings.

Figure 1:
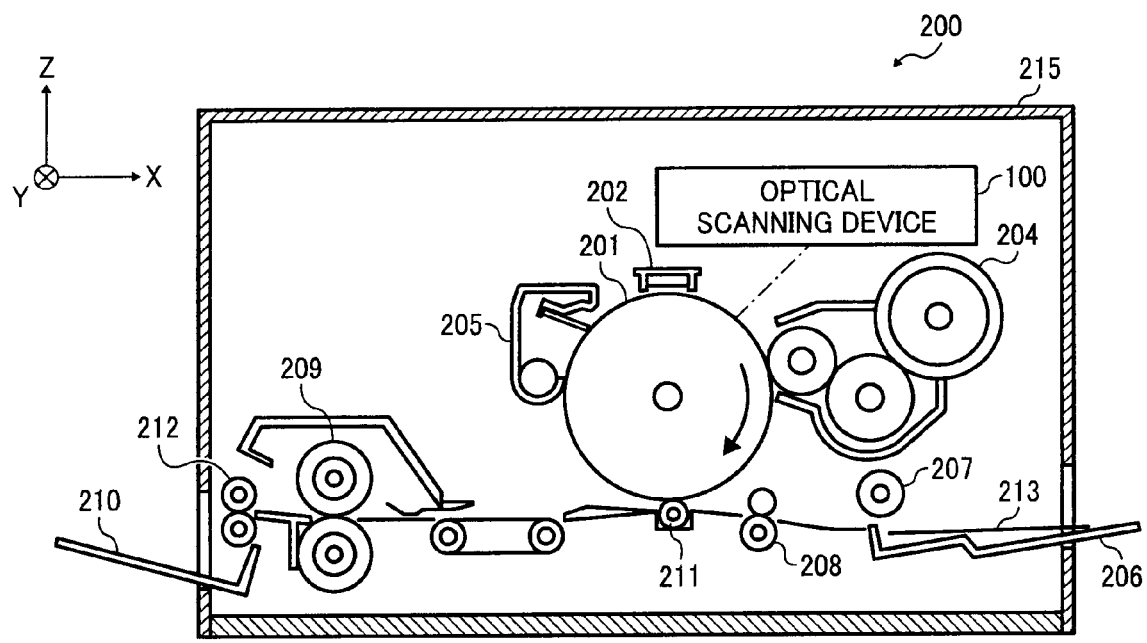
FIG. 1 is a schematic diagram for explaining the configuration of a printer according to a first embodiment of the present invention.

A first embodiment of the present invention is described based on FIGS. 1 to 16. FIG. 1 depicts a schematic configuration of an image forming apparatus 200 according to the first embodiment.

The image forming apparatus 200 is a printer that utilizes the Carlson process to transfer toner images on plain paper (sheet) and prints images. The image forming apparatus 200 includes, as shown in FIG. 1, an optical scanning device 100, a photosensitive drum 201, a charger 202, a toner cartridge 204, a cleaning case 205, a paper feed tray 206, a paper feed roller 207, a registration roller pair 208, a transfer charger 211, a fixing roller 209, a discharge roller 212, a discharged paper tray 210, and a housing 215 for accommodating such components.

The housing 215 is formed in a substantially rectangular parallelepiped shape and has openings communicating with the internal space at the walls on the +X and −X sides.

The optical scanning device 100 is placed upward within the housing 215 and deflects light beams modulated based on image information in a main scanning direction (Y axis direction in FIG. 1), so that the surface of the photosensitive drum 201 is scanned. The configuration of the optical scanning device 100 will be described later.

The photosensitive drum 201 is a cylindrical member on which a photosensitive layer which becomes conductive when irradiated with the light beam is formed. The photosensitive drum 201 is placed below the optical scanning device 100 with its longitudinal direction being along the Y axis direction, and rotated clockwise in FIG. 1 (in the direction indicated by the arrow in FIG. 1) by a rotating mechanism (not shown). On the circumference of the photosensitive drum 201, the charger 202 is placed at the 12 o'clock (top) position in FIG. 1, the toner cartridge 204 at the 2 o'clock position, the transfer charger 211 at the 6 o'clock position, and the cleaning case 205 at the 10 o'clock position.

The charger 202 is placed to be apart from the surface of the photosensitive drum 201 with a predetermined clearance therebetween and charges the surface of the photosensitive drum 201 at a predetermined voltage.

The toner cartridge 204 includes a cartridge main unit containing toner and a developing roller charged by a voltage of the opposite polarity to that of the photosensitive drum 201. The toner cartridge 204 supplies the toner contained in the cartridge main unit via the developing roller to the surface of the photosensitive drum 201.

The cleaning case 205 has a rectangular cleaning blade with its longitudinal direction being along the Y axis direction and is placed so that an end of the cleaning blade contacts the surface of the photosensitive drum 201. Toner attached to the surface of the photosensitive drum 201 is peeled by the cleaning blade during the rotation of the photosensitive drum 201 and collected in the cleaning case 205.

The transfer charger 211 is placed to be apart from the surface of the photosensitive drum 201 with a predetermined clearance therebetween and a voltage of the opposite polarity to that of the charger 202 is applied thereto.

The paper feed tray 206 is placed so that its +X side end extends from the opening formed at the +X side wall of the housing 215 and accommodates a plurality of sheets 213 externally supplied.

The paper feed roller 207 picks up one sheet 213 each from the paper feed tray 206 and guides the sheet via the registration roller pair 208 includes a pair of rotating rollers to the clearance made by the photosensitive drum 201 and the transfer charger 211.

The fixing roller 209 is formed of a pair of rotating rollers, heats and pressurizes the sheet 213, and guides the sheet to the discharge roller 212.

The discharge roller 212 includes of a pair of rotating rollers and stacks successively the sheet 213 fed from the fixing roller 209 in the discharged paper tray 210 that is placed so that its −X side end extends from the opening formed at the −X side wall of the housing 215.

Figure 2:
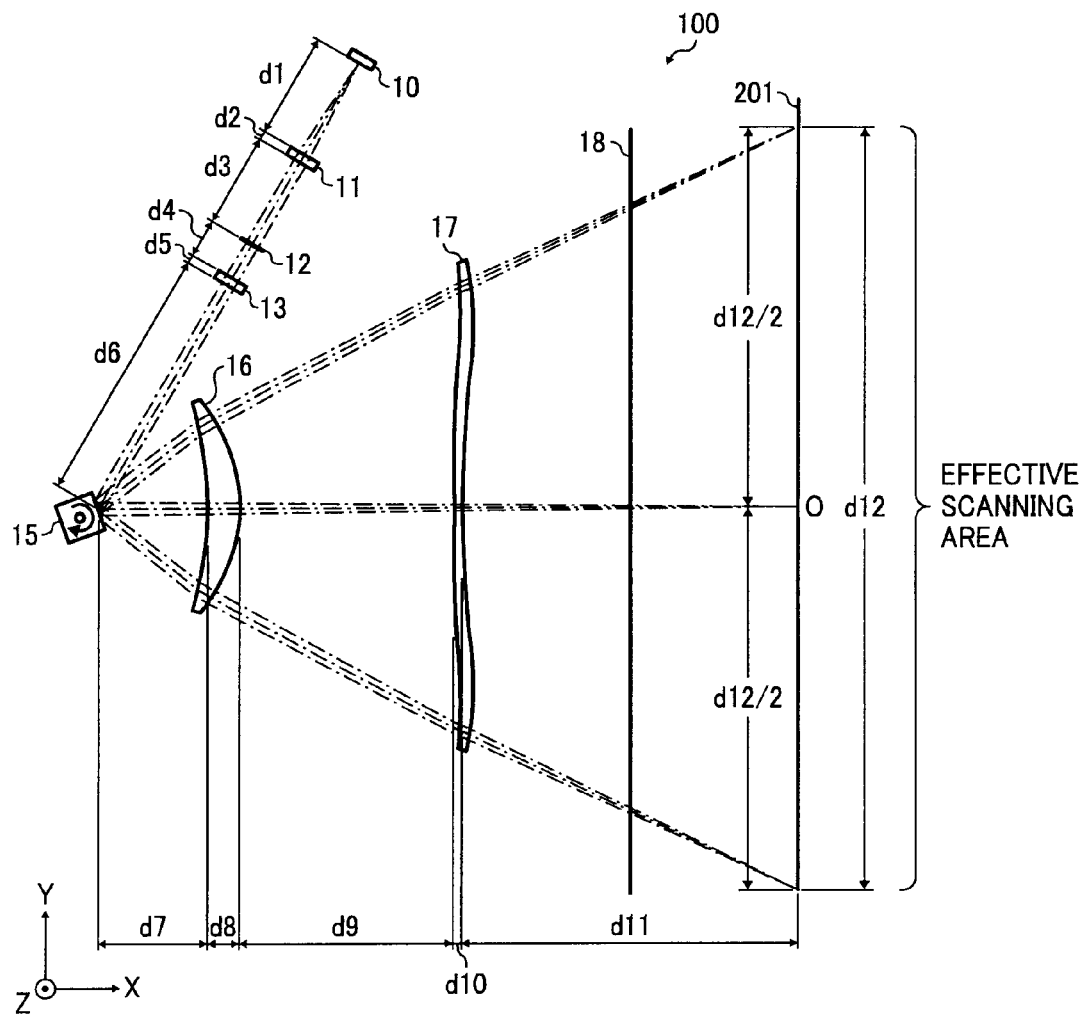
FIG. 2 is a schematic diagram for explaining the configuration of an optical scanning device shown in FIG. 1.

The configuration of the optical scanning device 100 is described next. FIG. 2 is a schematic diagram of configuration of the optical scanning device 100. As shown in FIG. 2, the optical scanning device 100 includes a light source 10, a coupling lens 11, an aperture member 12, a linear image-forming lens 13, and a polygon mirror 15 that are arranged successively along the obliquely lower left direction at 70 degrees from the light source 10, a first scanning lens 16 and a second scanning lens 17 that are successively arranged on the +X side of the polygon mirror 15, and a reflecting mirror 18 for reflecting the light beam which has passed through the second scanning lens 17 to guide to the photosensitive drum 201. The coordinate system whose x-axis direction is along the direction the coupling lens 11, the aperture member 12, the linear image-forming lens 13, and the polygon mirror 15 are arranged is defined and descriptions thereof will be made appropriately based on the coordinate system.

Figure 3:
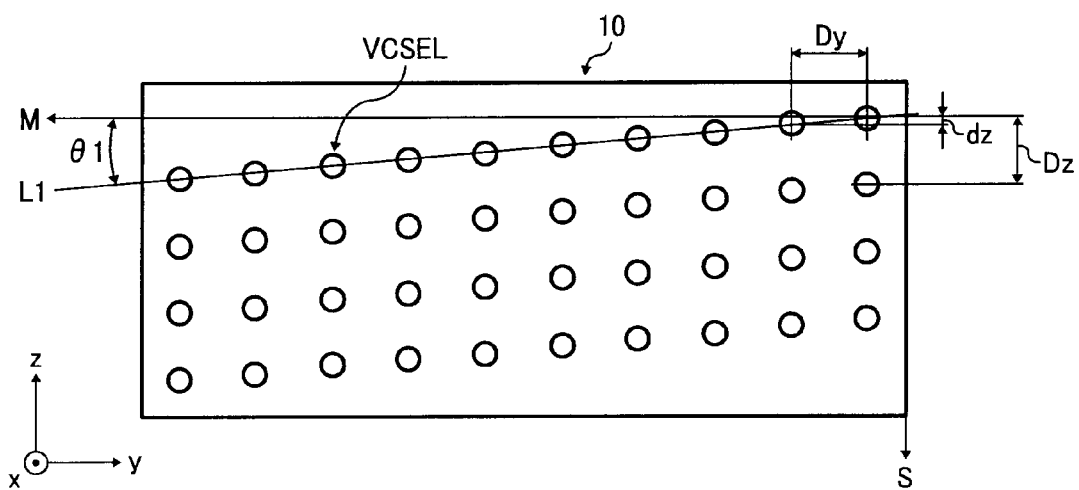
FIG. 3 is a schematic diagram for explaining a light source shown in FIG. 2.

The light source 10 is a surface emitting semiconductor laser array that emission points, for example, VCSELs are two-dimensionally arranged. As shown in FIG. 3, on the light emitting surface (−X side surface), 40 VCSELs are arranged in a four-row, ten-column matrix whose row direction is parallel to the line L1 making an angle θ1 with the y axis and column direction is parallel to the z axis. Each VCSEL has a near-field pattern diameter of 4 micrometers. A light beam with a wavelength of 780 nanometers is outputted from VCSEL at 7±1 degrees of main scanning direction and sub-scanning direction divergence angles. In the first embodiment, the distance Dz between rows is 25.0 micrometers while the distance Dy between columns 30.0 micrometers. The distance dz between adjacent VCSELs in the Z-axis direction (sub-scanning direction) is 2.5 micrometers (4800 dots per inch (dpi)).

The coupling lens 11 has a focal length of 47.7 millimeters and couples the light beams from the light source 10 at the focal position on the exit side.

The aperture member 12 has a rectangular or ellipsoidal opening with y-axis direction (main scanning direction) size of 5.44 millimeters and z-axis direction (sub-scanning direction) size of 2.10 millimeters, and is arranged so that the center of the opening is placed near the focal position of the coupling lens 11.

The linear image-forming lens 13 is a cylindrical lens with a focal length of 107.0 millimeters and images the light beams that have passed through the aperture member 12 near the reflecting surface of the polygon mirror 15 in the sub-scanning direction.

The polygon mirror 15 is formed in a quadrangular prism with its top surface being a square inscribed in a circle with 7 mm radius. Deflecting surfaces are formed at four side surfaces of the polygon mirror 15. The polygon mirror 15 is rotated about the axis parallel to the Z-axis by a rotating mechanism (not shown) at a fixed angular rate. The light beam entered in the polygon mirror 15 is deflected (scanned) in the Y axis direction.

The first scanning lens 16 and the second scanning lens 17 are resin scanning lenses with central thicknesses (on the optical axis) of 13.5 and 3.5 millimeters, respectively. The optical surface profiles are represented by the functions expressed by Equations (1) and (2). In Equations, Y indicates the main scanning direction coordinate with its origin being at the optical axis, Rm the radius of curvature of the lens, $a_{00}$, $a_{01}$, $a_{02}$, ... aspheric coefficients for the main-scanning profile, $R_{S0}$ the curvature on the optical axis in the sub-scanning direction, and $b_{00}$, $b_{01}$, $b_{02}$, ... aspheric coefficients for the sub-scanning profile. Table 1 indicates the values of the various coefficients.

$$X(Y) = \frac{Y^2}{R_m \left(1 + \sqrt{1 - (1 + a_{00}) \cdot \left(\frac{Y}{R_m}\right)^2}\right)} + a_{01} \cdot Y + a_{02} \cdot Y^2 + a_{03} \cdot Y^3 + a_{04} \cdot Y^4 + \ldots \quad (1)$$

$$Cs(Y) = \frac{1}{R_{S0}} + b_{01} \cdot Y + b_{02} \cdot Y^2 + b_{03} \cdot Y^3 + \ldots \quad (2)$$

TABLE 1

| | FIRST SCANNING LENS | | SECOND SCANNING LENS | |
|---|---|---|---|---|
| | FIRST SURFACE | SECOND SURFACE | FIRST SURFACE | SECOND SURFACE |
| $R_m$ | −120 | 59.279 | −10000 | 540.625 |
| $R_{s0}$ | −500 | −600 | 521.92 | −40.751 |
| $a_{00}$ | 0 | 0 | 0 | 0 |
| $a_{04}$ | $8.88524 \times 10^{-7}$ | $9.22409 \times 10^{-7}$ | $3.28563 \times 10^{-7}$ | $1.27798 \times 10^{-7}$ |
| $a_{06}$ | $-2.62914 \times 10^{-10}$ | $6.77825 \times 10^{-11}$ | $-7.08542 \times 10^{-11}$ | $-4.62873 \times 10^{-11}$ |
| $a_{08}$ | $2.18464 \times 10^{-14}$ | $-4.11244 \times 10^{-14}$ | $6.26922 \times 10^{-15}$ | $4.04921 \times 10^{-15}$ |
| $a_{10}$ | $1.36766 \times 10^{-17}$ | $1.3728 \times 10^{-17}$ | $-2.73157 \times 10^{-19}$ | $-1.65975 \times 10^{-19}$ |
| $a_{12}$ | $-3.13542 \times 10^{-21}$ | $2.06956 \times 10^{-21}$ | $4.73881 \times 10^{-24}$ | $2.58548 \times 10^{-24}$ |
| $b_{01}$ | 0 | $-1.59477 \times 10^{-6}$ | $-7.57567 \times 10^{-7}$ | 0 |
| $b_{02}$ | 0 | $-4.33213 \times 10^{-6}$ | $-1.1328 \times 10^{-6}$ | $2.31146 \times 10^{-7}$ |
| $b_{03}$ | 0 | $4.98199 \times 10^{-9}$ | $2.60617 \times 10^{-10}$ | 0 |
| $b_{04}$ | 0 | $-2.85938 \times 10^{-9}$ | $7.89614 \times 10^{-11}$ | 0 |
| $b_{05}$ | 0 | $-2.67713 \times 10^{-12}$ | $-5.02709 \times 10^{-14}$ | 0 |
| $b_{06}$ | 0 | $2.87783 \times 10^{-13}$ | $1.40512 \times 10^{-14}$ | 0 |
| $b_{07}$ | 0 | $-1.91653 \times 10^{-15}$ | $4.55389 \times 10^{-18}$ | 0 |
| $b_{08}$ | 0 | $2.04238 \times 10^{-15}$ | $-2.01401 \times 10^{-18}$ | 0 |
| $b_{09}$ | 0 | $1.01413 \times 10^{-18}$ | $-1.54602 \times 10^{-22}$ | 0 |
| $b_{10}$ | 0 | $-6.7299 \times 10^{-19}$ | $7.48935 \times 10^{-23}$ | 0 |

Figure 4A:
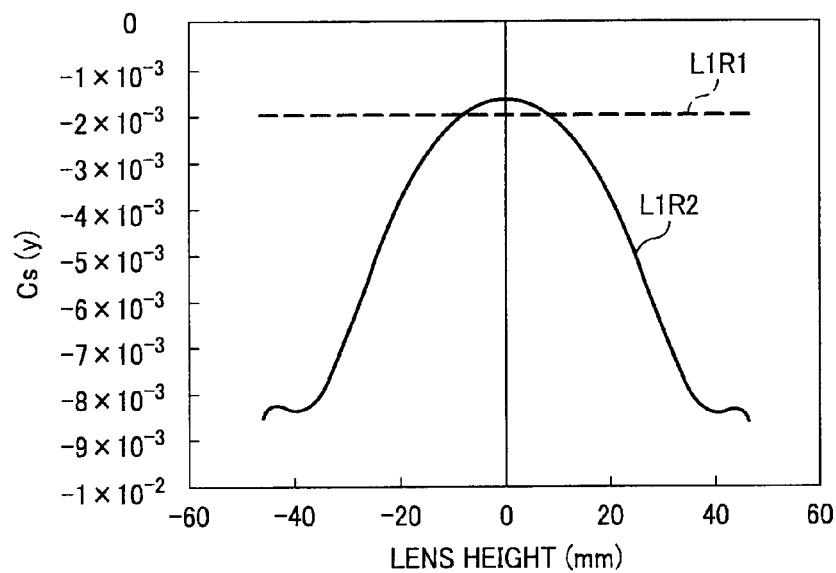
FIG. 4A is a graph for explaining a function Cs(Y) of sub-scanning direction curvature of a first scanning lens with respect to a lens height.
Figure 4B:
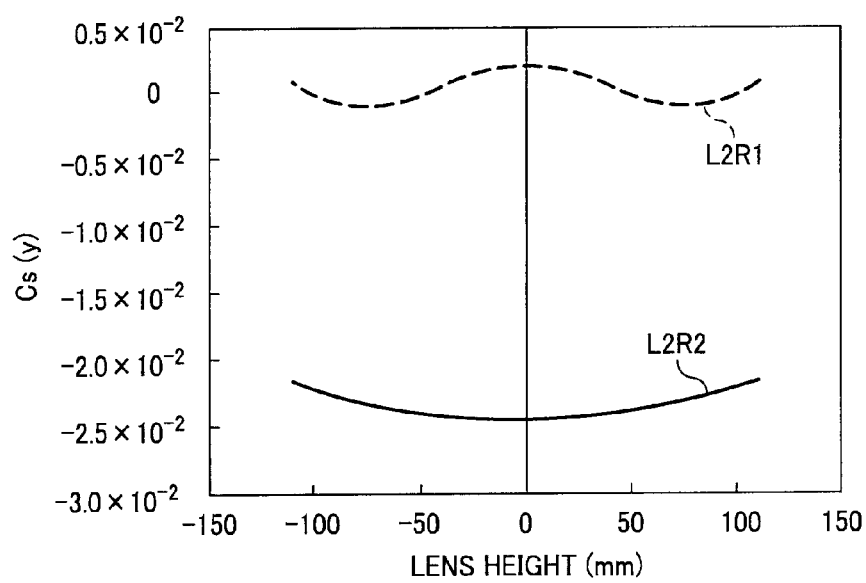
FIG. 4B is a graph for explaining a function Cs(Y) of sub-scanning direction curvature of a second scanning lens with respect to a lens height.

FIG. 4A depicts the function Cs(Y) of the sub-scanning direction curvature of the first scanning lens 16 expressed by Equation (2) with respect to the lens height. In FIG. 4A, the dotted line indicates the optical surface profile of the incident plane L1R1, while the solid curve the optical surface profile of the exit plane L1R2. FIG. 4B depicts the function Cs(Y) of the sub-scanning direction curvature of the second scanning lens 17 expressed by Equation (2) with respect to the lens height. In FIG. 4B, the dotted curve indicates the optical surface profile of the incident plane L2R1, while the solid curve the optical surface profile of the exit plane L2R2.

Figure 5A:
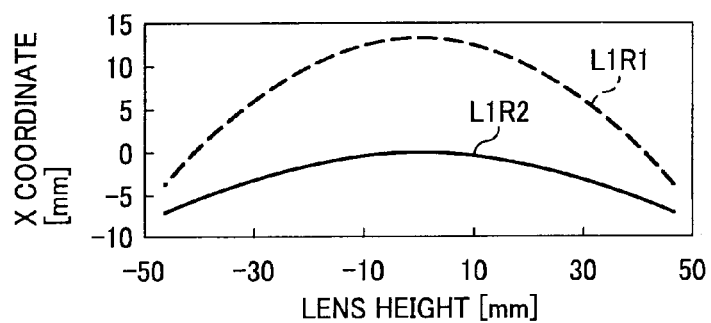
FIG. 5A is a graph for explaining a main-scanning cross-sectional profile of the first scanning lens.
Figure 5B:
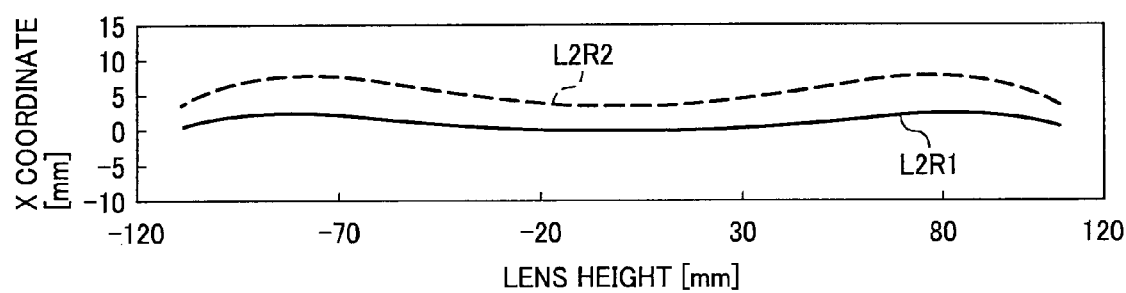
FIG. 5B is a graph for explaining a main-scanning cross-sectional profile of the second scanning lens.

FIG. 5A depicts the main-scanning cross-sectional profile of the first scanning lens 16 expressed by Equation (2). In FIG. 5A, the dotted curve indicates the optical surface profile of the incident plane L1R1, while the solid curve the optical surface profile of the exit plane L1R2. FIG. 5B depicts the main-scanning cross-sectional profile of the second scanning lens 17. In FIG. 5B, the dotted curve indicates the optical surface profile of the incident plane L2R1, while the solid curve the optical surface profile of the exit plane L2R2. The vertical axis indicates the coordinate X along the optical axis, while the horizontal axis the lens height. Unless otherwise noted, the optical axis refers to as the axis passing through the central point in the sub-scanning direction when Y=0 in Equation (2).

Optical distances between the elements shown in FIG. 2 d1, d3, d4, d6, d7, d9, and d11 and the optical axis direction sizes of the elements d2, d5, d8, and d10 are listed in Table 2. The sub-scanning direction lateral magnification of the entire optical system included in the optical scanning device 100 is 2.18, and the sub-scanning magnification of the optical system on the side of the scanned surface facing the polygon mirror 15 is −0.97. According to the optical scanning device 100, the beam spot diameter on the scanned surface is set to be 52 micrometers in the main scanning direction and 55 micrometers in the sub-scanning direction. The writing area expands ±161.5 millimeters from the point O shown in FIG. 2 in the main scanning direction (Y axis direction). The rotation angle (angle of view) of the polygon mirror 15 when scanning the writing area is 36 degrees and the angle of view is 72 degrees. The point O in FIG. 2 indicates the point at which the line passing through the rotation center of the polygon mirror 15 and parallel to the X-axis crosses the scanned surface of the photosensitive drum 201.

have their spot movement speeds in the main scanning direction adjusted by the first scanning lens 16 and the second scanning lens 17, and then collected via the reflecting mirror 18 on the surface of the photosensitive drum 201.

The surface of the photosensitive drum 201 is charged to a predetermined voltage by the charger 202, so that charges are distributed at a fixed charge density. When the photosensitive drum 201 is scanned with the light beams deflected by the polygon mirror 15, carriers (charges) are generated on parts of the photosensitive layer subjected to irradiation of the light beams. The charges transfer in such parts of the photosensitive layer and the potential is reduced. When the photosensitive drum 201 rotated in the direction of the arrow in FIG. 1 is scanned with the light beams modulated based on the image information, an electrostatic latent image defined by the charge distribution is formed on the surface of the photosensitive drum 201.

When the electrostatic latent image is formed on the surface of the photosensitive drum 201, toner stored in the toner cartridge 204 is supplied to the surface of the photosensitive drum 201 by the developing roller. Because the developing roller is charged to a voltage of the opposite polarity to that of the photosensitive drum 201, the toner attaching to the developing roller is charged to the same polarity as that of the photosensitive drum 201. The toner is not attached to the part of surface of the photosensitive drum 201 that charges are distributed but to the scanned part. A toner image that is the visualization of the electrostatic latent image is thus formed on the surface of the photosensitive drum 201. The toner image is attached to the sheet 213 by the transfer charger and then fixed by the fixing roller 209, so that the resulting image is formed on the sheet. The sheet 213 on which the image is formed is discharged by the discharge roller 212 and successively stacked in the discharged paper tray 210.

In the optical scanning device 100 according to the first embodiment, the margin width d of the polygon mirror 15 seen from the light beam entering the polygon mirror 15 is represented by Equation (3) where W indicates the distance between emission points spaced farthest apart from each other in the main scanning direction of the light source 10 (=270 μm), E the main scanning direction size of opening of the aperture member 12 (=5.44 mm), Rc the radius of inscribed circle of the polygon mirror 15 (=7 mm), M the number of deflecting surfaces of the polygon mirror 15 (=4),

TABLE 2

UNIT mm

| d1 | d2 | d3 | d4 | d5 | d6 | d7 | d8 | d9 | d10 | d11 |
|---|---|---|---|---|---|---|---|---|---|---|
| 46.06 | 3.0 | 70.0 | 12.85 | 3.0 | 45.15 | 46.31 | 13.5 | 89.73 | 3.5 | 141.36 |

The operation of the image forming apparatus 200 with the above configuration is described below. When image information is received from higher-level devices, the optical scanning device 100 is driven by modulated data based on the image information. 40 light beams modulated based on the image information are outputted from the light source unit 70. Such light beams are formed into substantially parallel rays by the coupling lens 11 and then pass through the aperture member 12.

The light beams that have passed through the aperture member 12 are collected on the deflecting surface of the polygon mirror 15 by the linear image-forming lens 13, deflected in the Y axis direction by the polygon mirror 15, a the incident angle of the light beam entering the polygon mirror 15 (=70 degrees), f the angle of view when the writing area is scanned (=72 degrees), x the distance from the aperture member 12 to the deflecting surface of the polygon mirror 15 (=61 mm), and $f_1$ the focal length of the coupling lens 11 (=47.7 mm). In the first embodiment, the margin width d is 0.93 which is larger than zero.

$$\delta = 2Rc \times \tan\left(\frac{\pi}{M}\right) \times \cos\left(\frac{\alpha + \varphi/4}{2}\right) - E - W \times \frac{x}{f_1} - Rc \times \sin\frac{\phi}{2}\cos\frac{\alpha}{2} \quad (3)$$

If the elements are set so that, for example, the size of the polygon mirror 15 is minimized within the range that the condition indicated by Equation (3) is satisfied, the eclipse of the light beam in the main scanning direction is prevented and the compactness of the polygon mirror 15 is accomplished. The cost reduction of the apparatus is realized. The compact polygon mirror 15 enables reduced consumption energy and amount of heat generated in its drive system. Deteriorations in various optical characteristics including the increase in spot diameter of the light beam caused by the temperature variation, the unevenness of scanning pitch, and the variation in sub-scanning direction beam pitch are suppressed and high quality images are obtained in continuous prints. Even in rotating polygon mirrors with conventional sizes, the angle of view when the scanned surface is scanned can be increased. The path of the light beam behind the rotating polygon mirror is shortened, so that the compactness and cost reduction of the optical scanning device are realized.

If in the same optical system except for the configuration of the polygon mirror 15, for example, a polygon mirror with six deflecting surfaces and 13 mm radius of the inscribed circle is used, the margin width d is calculated as −1.23 which does not satisfy the condition expressed by Equation (3) and can cause the eclipse of the light beam entering the polygon mirror. If the polygon mirror with six deflecting surfaces is used, the margin width d is 0.37 at 18 millimeters of radius of the inscribed circle. This margin width satisfies the condition expressed by Equation (3). The eclipse of the light beam is avoided and the optical scanning device with suppressed deteriorations in various optical characteristics is obtained.

$2A \cdot \tan(p/M)$ in the first term of Equation (3) indicates the main scanning direction length of the reflecting surface and is multiplied by $\cos((a+(f/4)/2)$ to indicate the length of projection of the light beam on the deflecting surface of the polygon mirror 15. The third term indicates the width of the luminous flux entering the rotating polygon mirror in the main scanning direction. The fourth term indicates the movement distance of the center on the reflecting surface in the main scanning direction, seen from the direction the light beam enters at the time of one-line scanning. If the solution by subtracting the second, third, and fourth terms from the first term is larger than zero, the optical scanning device without the eclipse by the rotating polygon mirror is provided.

According to the first embodiment, the distances between adjacent emission points of the light source 10 in the sub-scanning direction are equal, i.e., 2.5 micrometers (4800 dpi). Ten emission points are arranged in the direction parallel to the line L1 and four emission points are arranged in the sub-scanning direction. The distance between emission points spaced farthest apart from each other in the main scanning direction is larger than the distance between emission points spaced farthest apart from each other in the sub-scanning direction. More emission points are arranged in the main scanning direction than in the sub-scanning direction, which provides the following advantages.

In the light source 10, ten emission points are arranged in the main scanning direction, the distance between emission points spaced farthest apart from each other in the main scanning direction is 270 micrometers (Dm×9), and the total number of emission points is 40. The distance between emission points spaced farthest apart from each other in the sub-scanning direction is 97.5 micrometers (=d×39). To realize high density scanning, emission points are gathered in the sub-scanning direction. To improve the performance, yield, and lifetime of elements, the region emission points are arranged is desirably wider in the main scanning direction than in the sub-scanning direction. If the emission points are arranged in the region expanding in the sub-scanning direction, deterioration in optical performance caused by the temperature variation gets worse. The expansion of scanning lenses due to the temperature variation and changes in the optical magnification due to changes in the refractive index cause dot position shifts in the sub-scanning direction. Such shift becomes wider as the emission point is away from the optical axis of the optical system in the sub-scanning direction. The influence of the variation in distance between scanning lines by temperature is maximum between emission points farthest apart from each other in the sub-scanning direction. This is because a scanning line formed by emission points on the sub-scanning direction plus side with respect to the optical axis is bent in the opposite direction to a scanning line formed by emission points on the sub-scanning direction minus side, due to the difference in the sub-scanning lateral magnification of the scanning optical system. A large error in distance between scanning lines generated when the scanning lines bent in opposite directions from each other are adjacent causes the dot position shift in the sub-scanning direction and is perceived as banding appearing every scanning, resulting in deteriorated scanning quality. If the scanning lens is made of resin molding for cost reduction, the aforementioned problems become worse because the thermal expansion and refractive index of resins vary wider by the temperature variation than those of glasses. The present invention solves such problems effectively.

Figure 6:
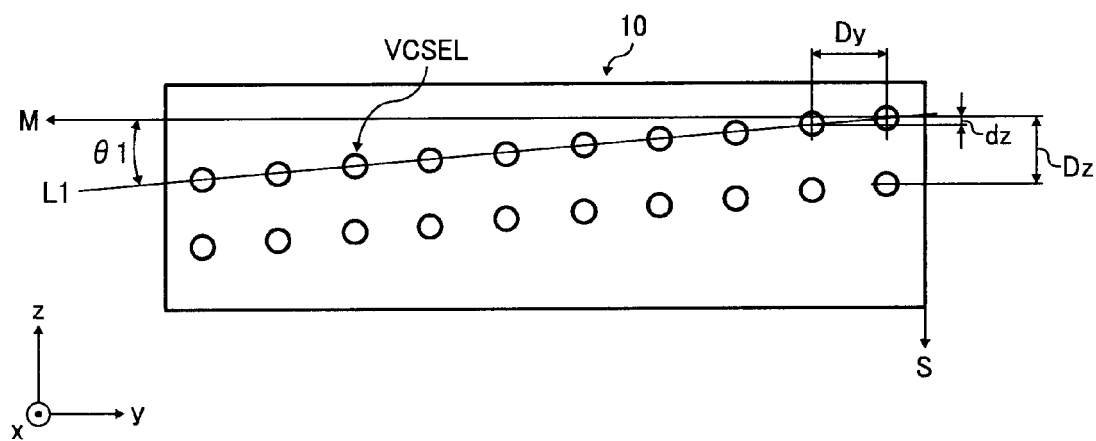
FIG. 6 is a schematic diagram for explaining a modification of the light source.

FIG. 6 depicts the modification of the light source 10. Dy is 40 micrometers, Dz 45 micrometers, and dz 4.5 micrometers (2400 dpi). The distance between emission points spaced farthest apart from each other in the main scanning direction is 360 micrometers and the distance between emission points spaced farthest apart from each other in the sub-scanning direction is 85.5 millimeters. To realize the cost reduction of the apparatus and high quality optical scanning at 2400 dpi, the sub-scanning direction width of the region where emission points are arranged is shorter than 100 micrometers. The margin width d with this light source is calculated as 0.81 and the deterioration and variation of the optical characteristics are small between channels.

The relationship between the magnification of the optical system, the near-field pattern of the light emitting unit, and the beam spot diameter are described next.

Figure 7A:
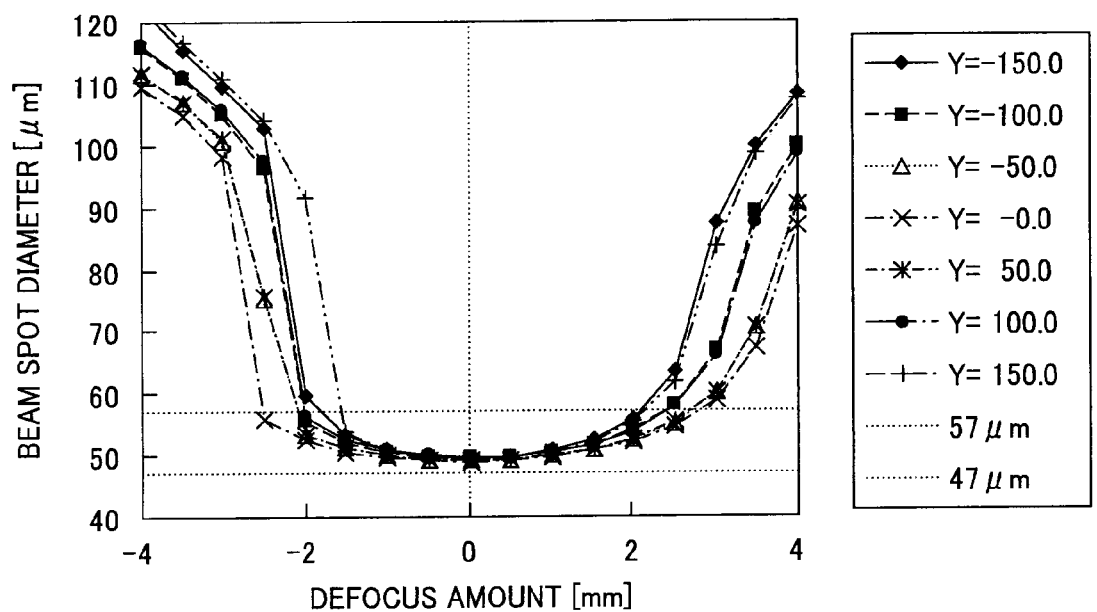
FIGS. 7A and 7B are graphs (1) for explaining a relationship between a beam spot diameter and a defocus amount when the same optical system as in the first embodiment is used.
Figure 7B:
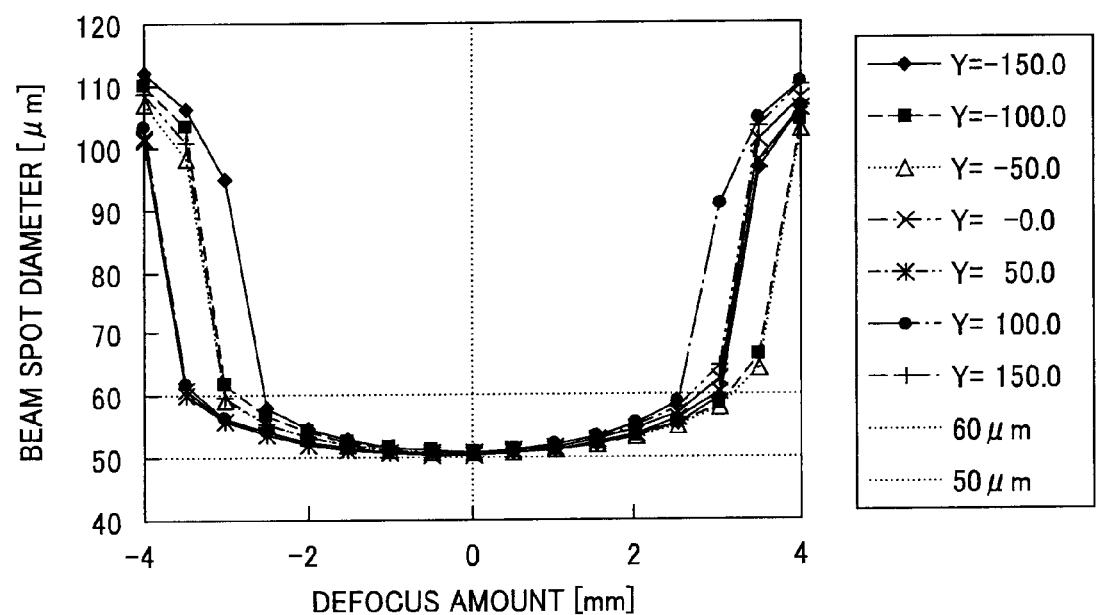
Figure 8A:
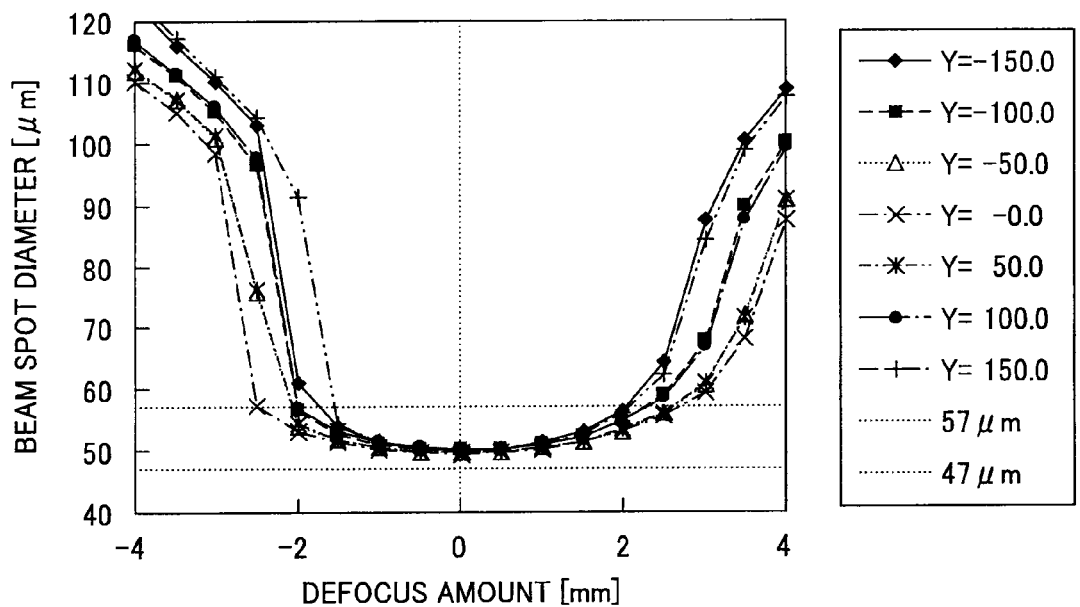
FIGS. 8A and 8B are graphs (2) for explaining a relationship between a beam spot diameter and a defocus amount when the same optical system as in the first embodiment is used.
Figure 8B:
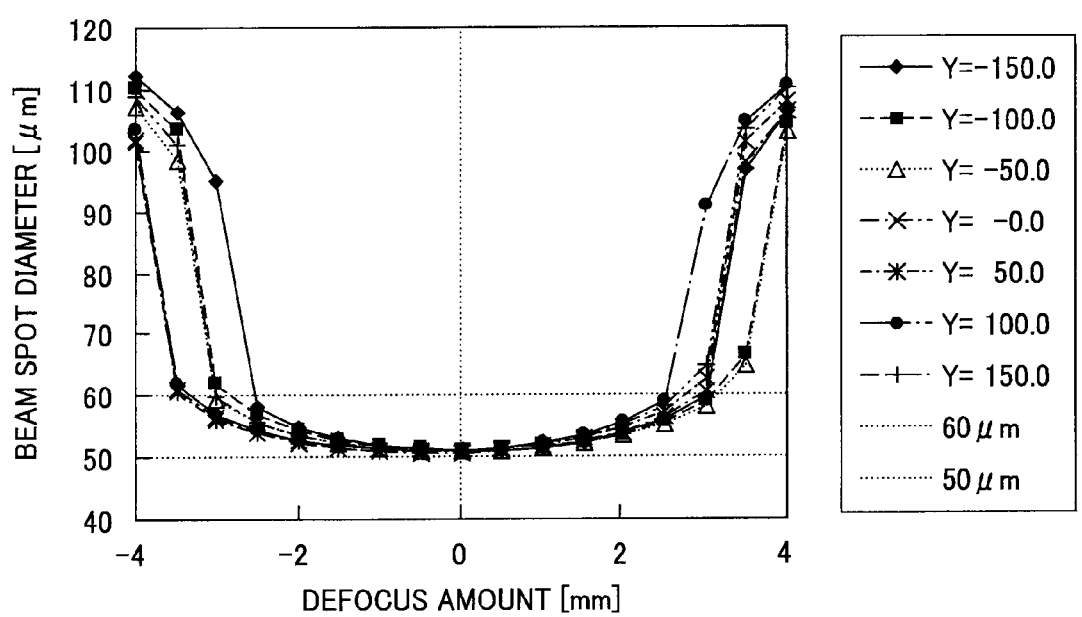
Figure 9A:
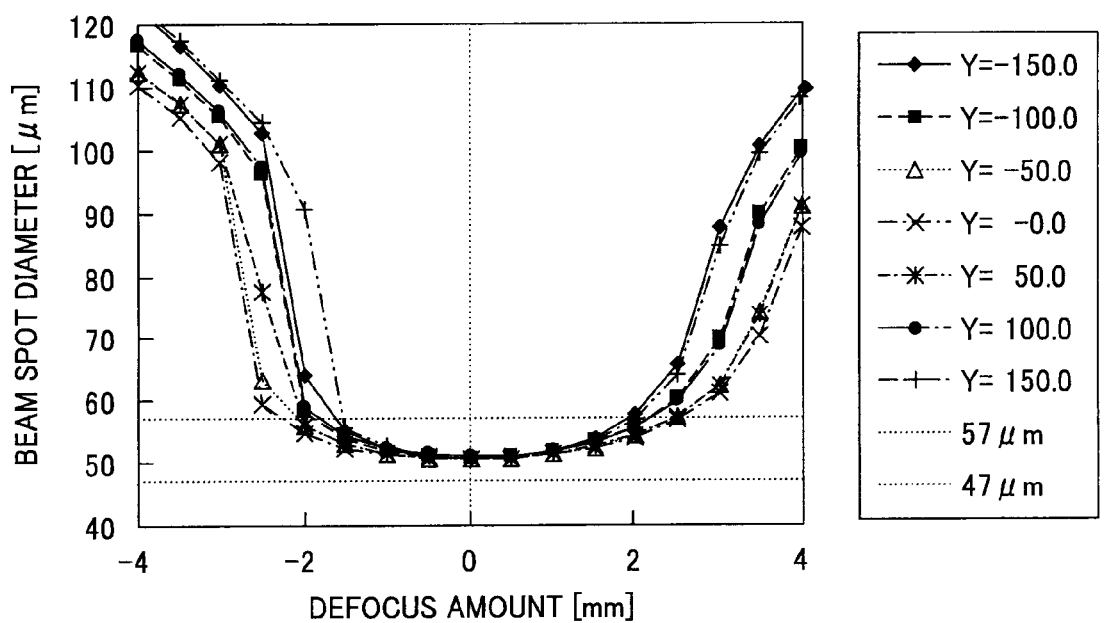
FIGS. 9A and 9B are graphs (3) for explaining a relationship between a beam spot diameter and a defocus amount when the same optical system as in the first embodiment is used.
Figure 9B:
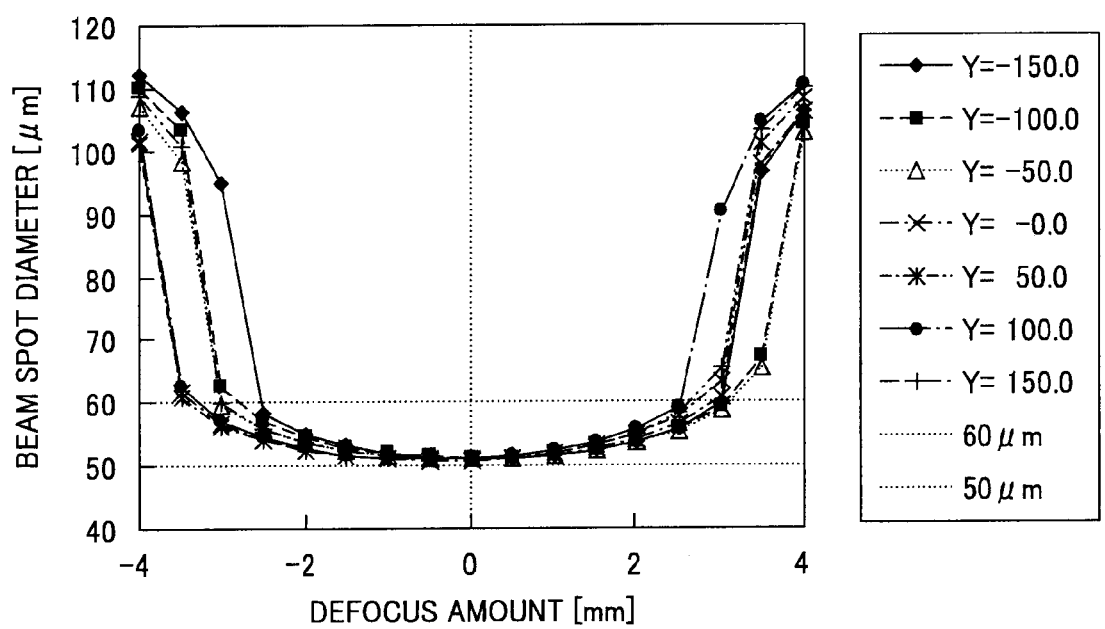
Figure 10A:
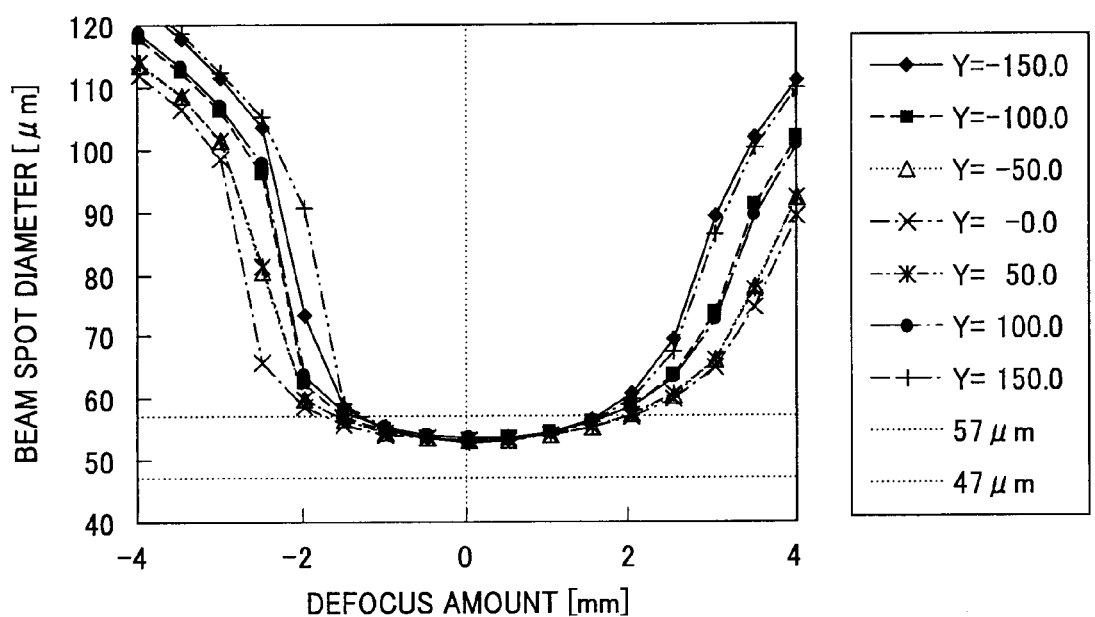
FIGS. 10A and 10B are graphs (4) for explaining a relationship between a beam spot diameter and a defocus amount when the same optical system as in the first embodiment is used.
Figure 10B:
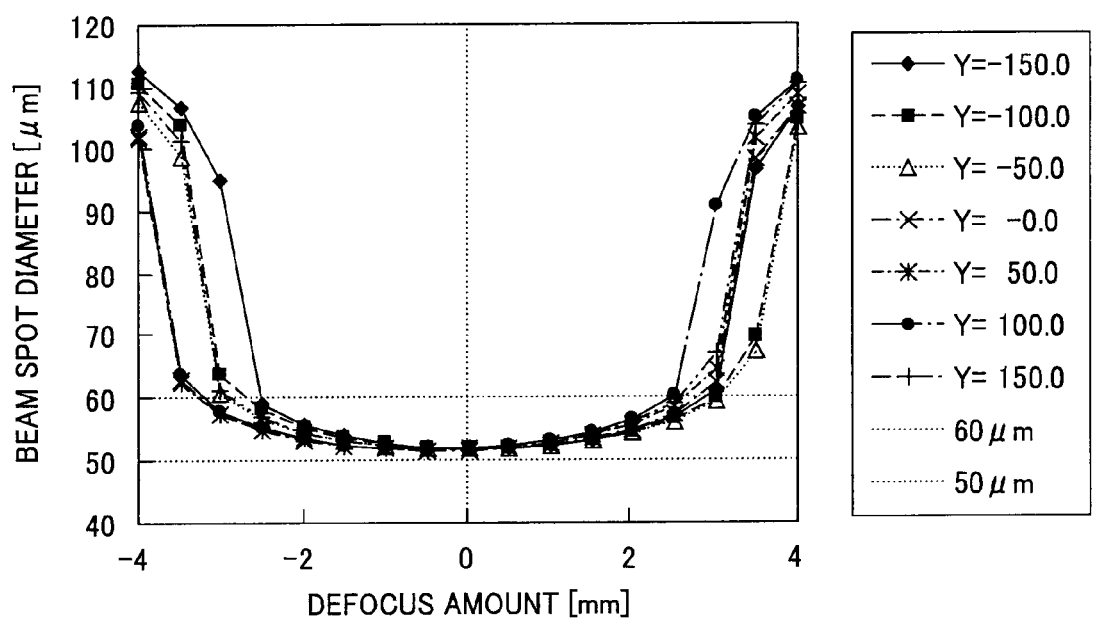

FIGS. 7A to 10B depict the results of simulation of the relationship between the beam spot diameter and the defocus amount when an optical system including a coupling lens with a focal length of 47.7 millimeters (the lateral magnification in the main scanning direction is about 5.0, while the lateral magnification in the sub-scanning direction 2.0) is used. FIG. 7A depicts the beam spot diameter in the main scanning direction when the near-field pattern in the main scanning direction (Am) is infinitely small (=0). FIG. 7B depicts the beam spot diameter in the sub-scanning direction when the near-field pattern in the sub-scanning direction (As) is infinitely small (=0). FIG. 8A depicts the beam spot diameter in the main scanning direction when Am is 2 micrometers, while FIG. 8B the beam spot diameter in the sub-scanning direction when As is 2 micrometers. FIG. 9A depicts the beam spot diameter in the main scanning direction when Am is 4 micrometers, while FIG. 9B the beam spot diameter in the sub-scanning direction when As is 4 micrometers. FIG. 10A depicts the beam spot diameter in the main scanning direction when Am is 6 micrometers, while FIG. 10B the beam spot diameter in the sub-scanning direction when As is 6 micrometers.

Figure 11A:
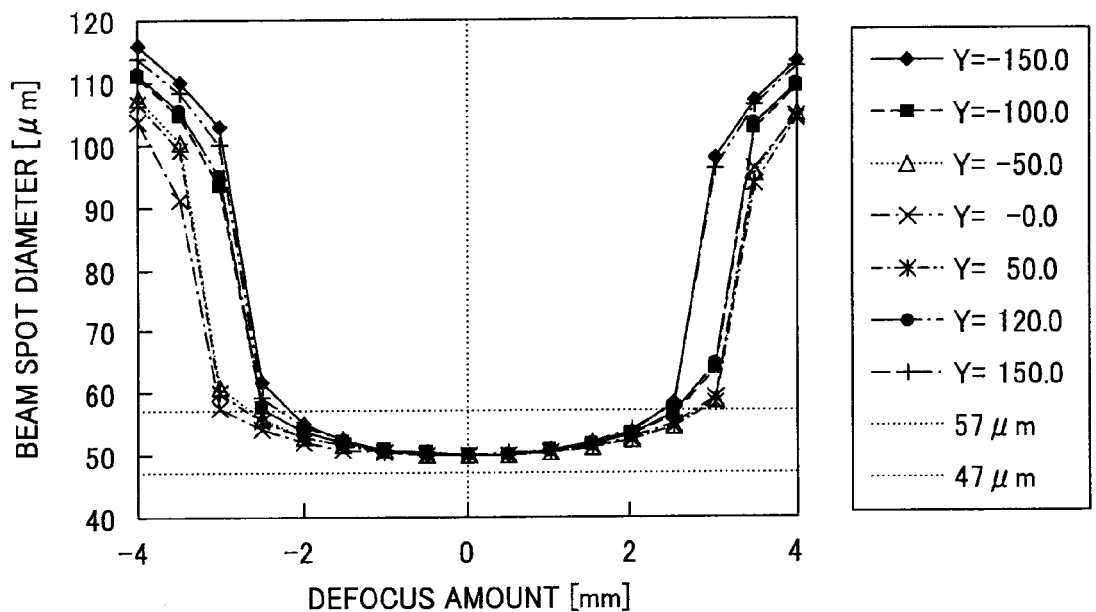
FIGS. 11A and 11B are graphs (1) for explaining a relationship between a beam spot diameter and a defocus amount in a conventional optical system.
Figure 11B:
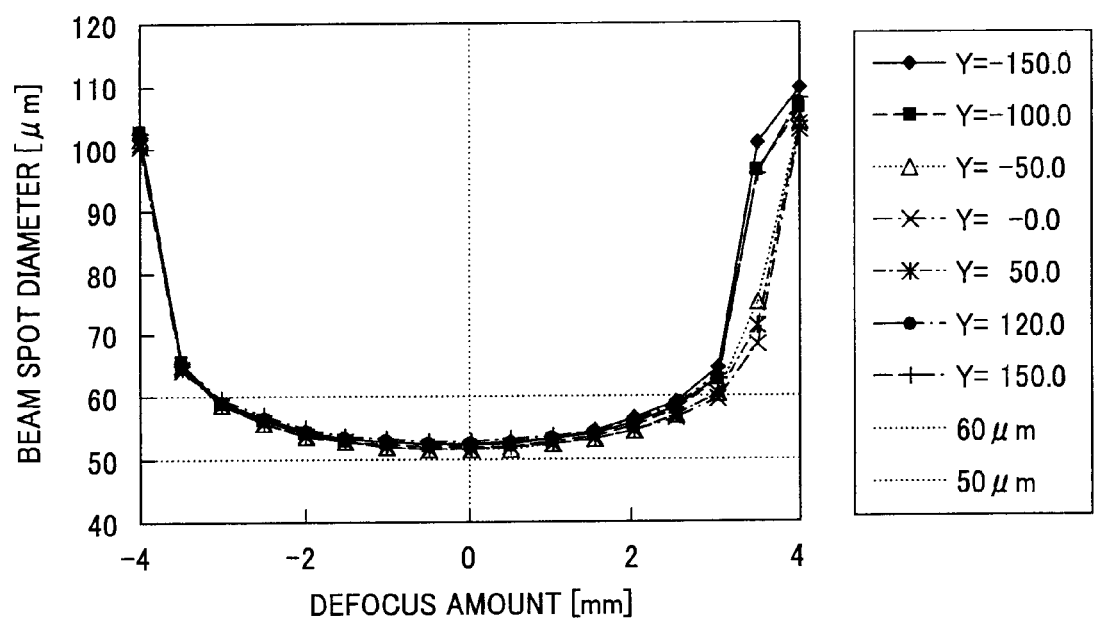
Figure 12A:
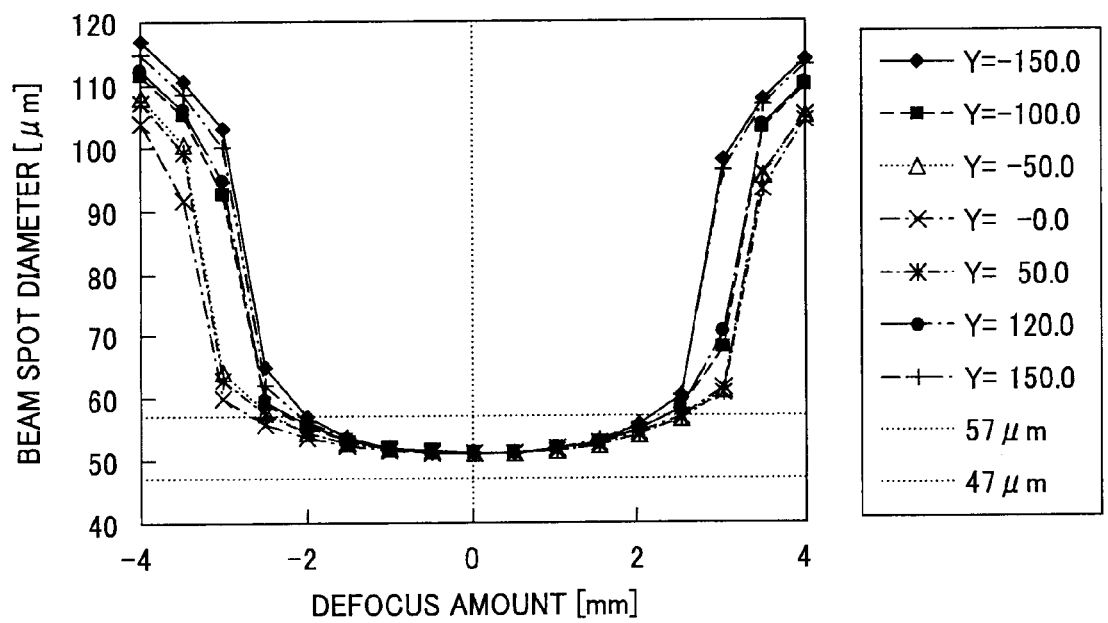
FIGS. 12A and 12B are graphs (2) for explaining a relationship between a beam spot diameter and a defocus amount in the conventional optical system.
Figure 12B:
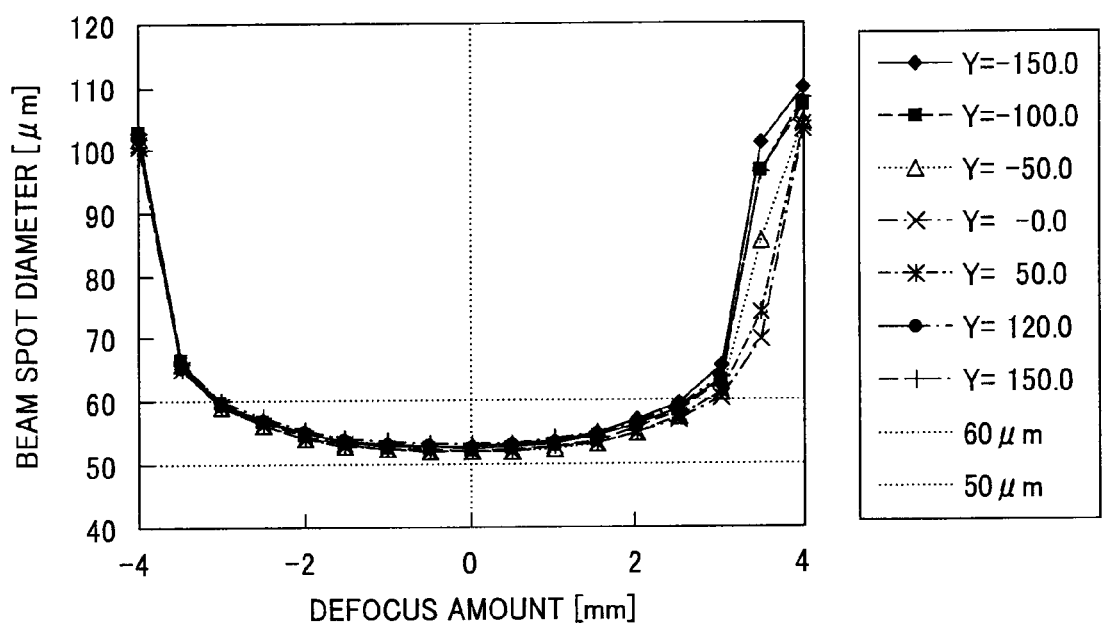
Figure 13A:
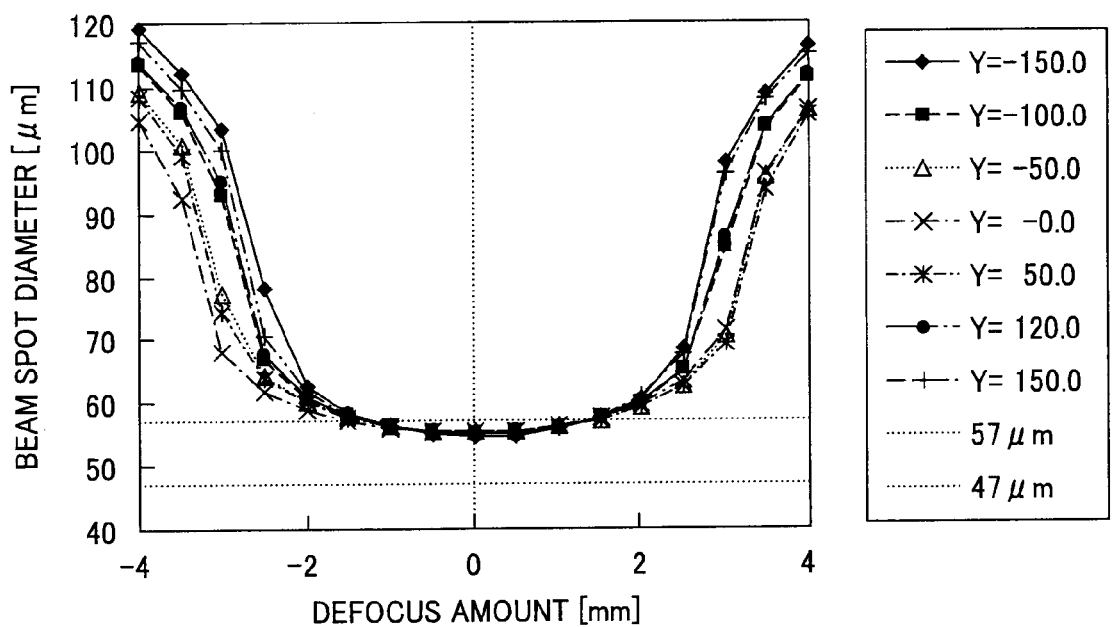
FIGS. 13A and 13B are graphs (3) for explaining a relationship between a beam spot diameter and a defocus amount in the conventional optical system.
Figure 13B:
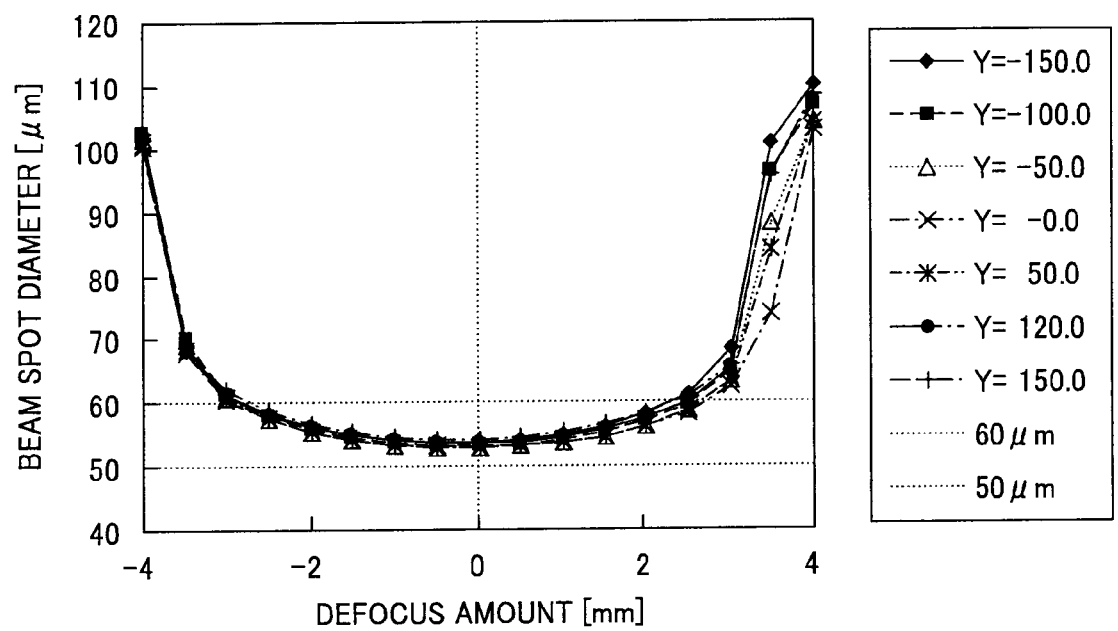
Figure 14A:
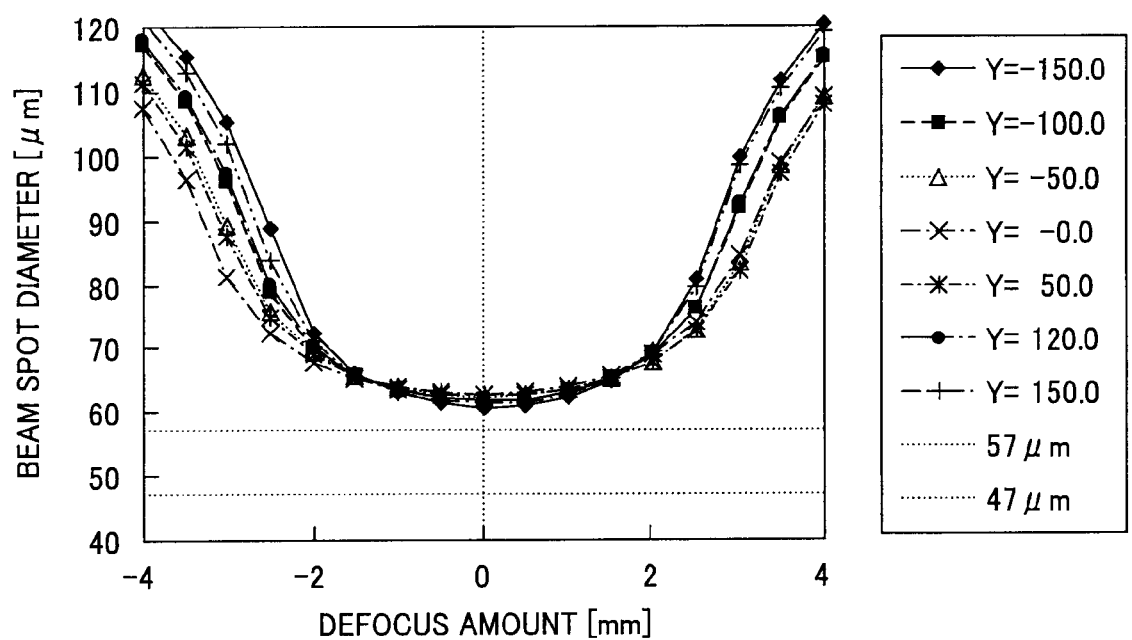
FIGS. 14A and 14B are graphs (4) for explaining a relationship between a beam spot diameter and a defocus amount in the conventional optical system.
Figure 14B:
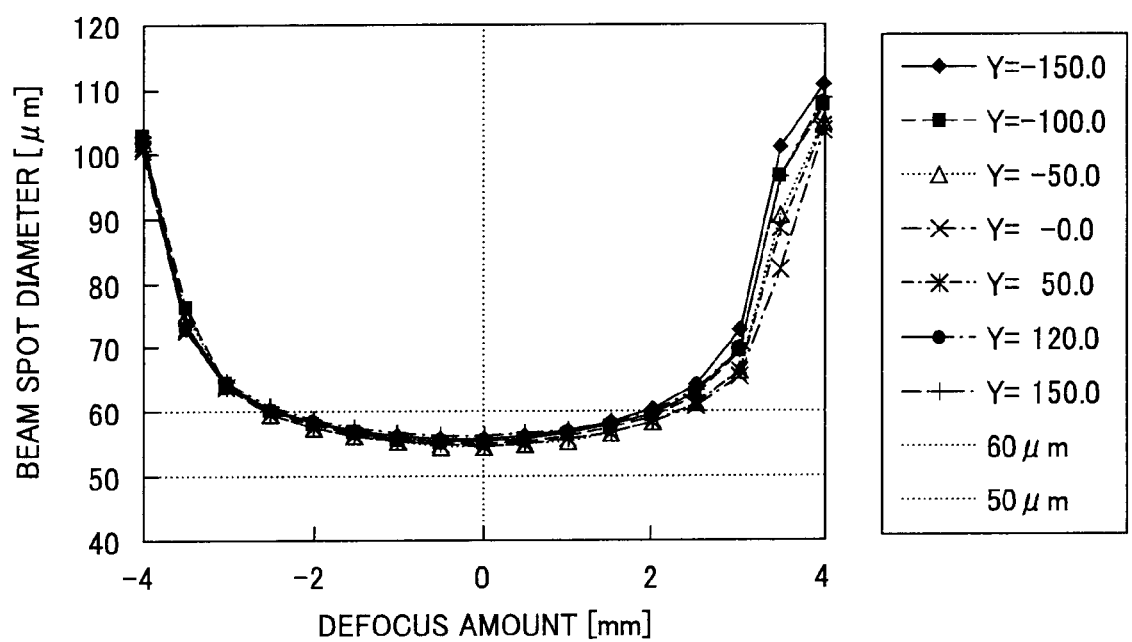

FIGS. 11A to 14B depict the results of simulation of the relationship between the beam spot diameter and the defocus amount when the conventional optical system including a coupling lens with a focal length of 26.8 millimeters (the lateral magnification in the main scanning direction is about 8.9, while the lateral magnification in the sub-scanning direction is 4.5) is used. FIG. 11A depicts the beam spot diameter in the main scanning direction when Am is infinitely small (=0), while FIG. 11B the beam spot diameter in the sub-scanning direction when As is infinitely small (=0). FIG. 12A depicts the beam spot diameter in the main scanning direction when Am is 2 micrometers, while FIG. 12B the beam spot diameter in the sub-scanning direction when As is 2 micrometers. FIG. 13A depicts the beam spot diameter in the main scanning direction when Am is 4 micrometers, while FIG. 13B the beam spot diameter in the sub-scanning direction when As is 4 micrometers. FIG. 14A depicts the beam spot diameter in the main scanning direction when Am is 6 micrometers, while FIG. 14B the beam spot diameter in the sub-scanning direction when As is 6 micrometers.

In the above optical systems, the target value of the beam spot diameter in the main scanning direction is determined to be 52±5 micrometers and the target value of the beam spot diameter in the sub-scanning direction is determined to be 55±5 micrometers. Their boundaries are drawn by dotted lines in FIGS. 7A to 14B.

According to the conventional optical system, the focal depth is ensured sufficiently up to 2 micrometers of Am and the variation in the beam spot diameter is not so large. When Am is equal to or larger than 4 micrometers, the focal depth decreases drastically in the main scanning direction and the apparatus with large variation is provided. According to the same optical system as in the first embodiment, the focal depth is ensured up to Am=6 and the increase in the beam spot diameter is within the acceptable range.

It is found that optical systems with low lateral magnifications are required for light sources having a few or more micrometers of the near-field pattern. As VCSEL is such light source, the following Equation (4) is desirably satisfied in one of the directions corresponding to the sub-scanning direction and the main scanning direction. Equation (4) uses the near-field pattern A, the lateral magnification β of the entire optical system including the scanning optical system, and the beam spot diameter ω on a scanned surface.

$$\left\{\left(\frac{\omega}{\beta \cdot A}\right)^2 - \frac{1}{2}\right\}^{-\frac{1}{2}} < 0.7 \quad (4)$$

Figure 15:
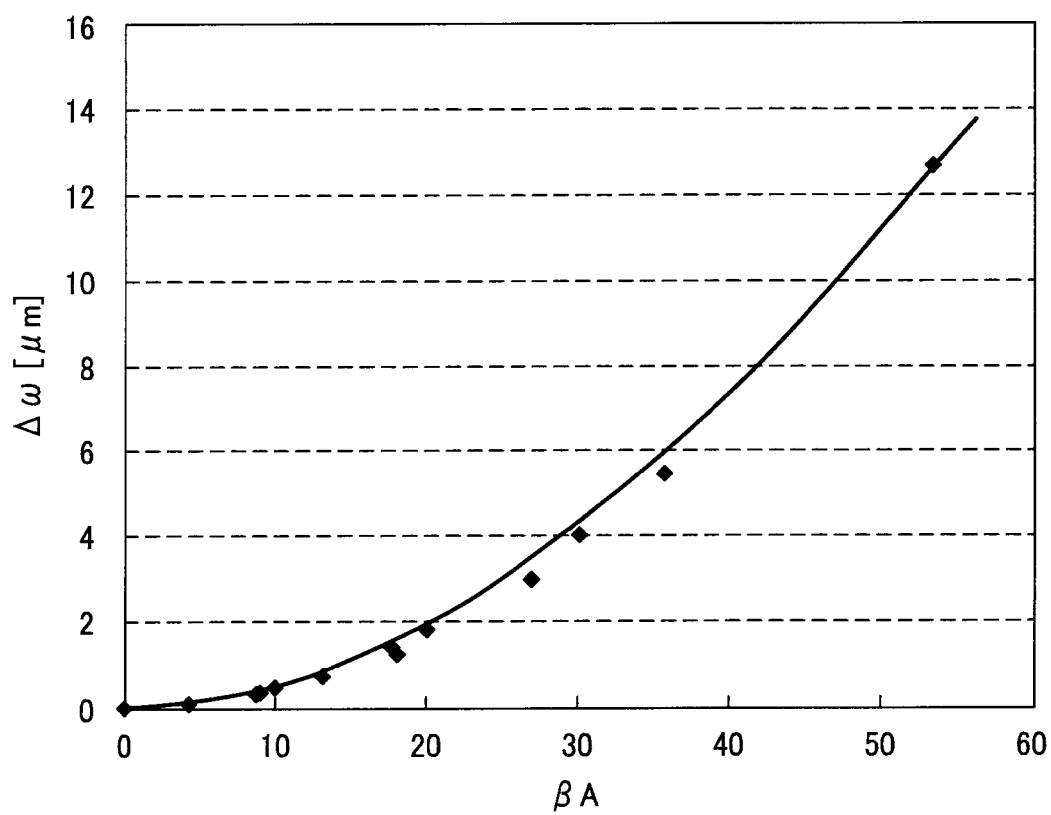
FIG. 15 is a graph for explaining a difference between a beam spot diameter when $(\beta \times A)=0$ and a beam spot diameter when $(\beta \times A)>0$ at zero of the defocus amount.

Equation (4) is described below with reference to FIG. 15. FIG. 15 is a plot of the difference between the beam spot diameter when (β×A)=0 (i.e., A=0) and the beam spot diameter when (β×A)>0 at zero defocus amount calculated from FIGS. 7A to 14B. The curve in FIG. 15 is expressed by the following Equation (5). In Equation (5), $\omega_0$ indicates the beam spot diameter when A=0. The relationship between the beam spot diameter $\omega_0$ and the beam spot diameter ω when A≠0 is assumed to be expressed by Equation (6).

$$\Delta\omega = \omega - \omega_0 = \omega_0 \left\{\sqrt{1 + \frac{1}{2}\left(\frac{\beta A}{\omega_0}\right)^2} - 1\right\} \quad (5)$$

$$\omega = \sqrt{\omega_0^2 + \frac{1}{2}(\beta A)^2} \quad (6)$$

As seen from FIG. 15, the increase in the beam spot diameter in actual writing optical systems coincides with the assumption. The increase rate d of the beam spot diameter provided for obtaining A which is larger than zero is expressed by Equation (7) where k=βA/$\omega_0$.

$$\delta = \Delta\omega/\omega_0 = \sqrt{1 + \frac{1}{2}k^2} - 1 \quad (7)$$

According to the first embodiment, k=5.0×4÷50=0.40 in the main scanning direction. d is as low as about 4% and the beam spot diameter in the main scanning direction is 52 micrometers and changes little. In the sub-scanning direction, k is calculated as 0.14, the beam spot diameter does not change substantially and is 55.5 micrometers when $\omega_0$=55 μm.

According to the conventional case, the lateral magnification in the main scanning direction is 8.9, k=0.712 and ω=56 μm, which is a 10% or higher increase. If the near-field pattern is enlarged, for example, A=7 μm, k=0.7 and ω=56 μm when the lateral magnification is 5 and the target beam spot diameter is 50 micrometers, which is undesirable for high image qualities. If k=0.65 (for example, β=5, A=6.5, $\omega_0$=50), ω=55 μm which is about a 10% change. The deterioration in image quality is within the acceptable range.

It is thus desirable that k=βA/$\omega_0$<0.7 is at least satisfied. The relationship between this Equation and the actual beam spot diameter ω is expressed by Equation (8) from Equation (7).

$$k = \left\{\left(\frac{\omega}{\beta A}\right)^2 - \frac{1}{2}\right\}^{-\frac{1}{2}} \quad (8)$$

While VCSEL has only around 1 to 2 milliwatts and optical outputs should be improved, a larger near-field pattern is advantageous in this case. Even if the diameter and the optical output are increased in the region where multi-mode oscillation does not occur, the image quality cannot be improved unless the beam spot diameter is reduced. By performing setups so that Equation (4) is satisfied, the beam spot diameter is reduced while utilizing VCSEL which is advantageous in the amount of light.

According to the light source 10 of the first embodiment, the distance between emission points spaced farthest apart from each other in the main scanning direction is 270 micrometers which is longer than the distance between emission points spaced farthest apart from each other in the sub-scanning direction, 97.5 micrometers. The lateral magnification of the optical scanning device 100 in the main scanning direction is larger than that of the optical system in the sub-scanning direction. A desired beam pitch in the sub-scanning direction is realized at the time of high density writing. Its explanations are made with reference to FIGS. 16A and 16B.

Figure 16A:
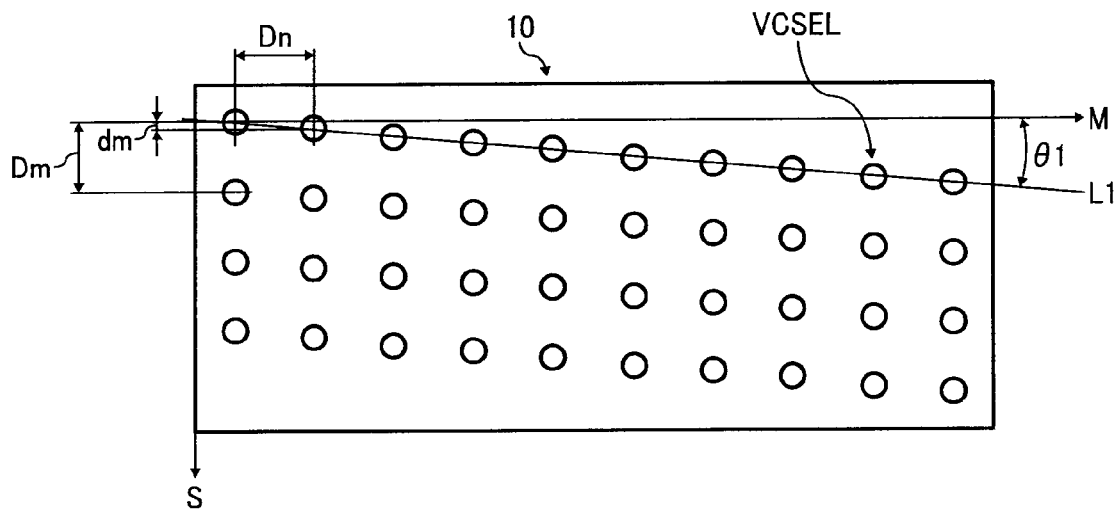
FIGS. 16A and 16B are schematic diagrams for explaining effects obtained when a distance between emission points spaced farthest apart from each other in the main scanning direction is larger than a distance between emission points spaced farthest apart from each other in the sub-scanning direction and the lateral magnification of the optical scanning device in the main scanning direction is larger than the lateral magnification of the optical system in the sub-scanning direction.

FIG. 16A depicts a conventional surface emitting laser with two-dimensional arrangement. As shown in FIG. 16A, according to the conventional surface emitting laser, VCSELs serving as emission points are arranged in an eight-row, four-column matrix that the column direction corresponds to the substantially main scanning direction, while the row direction the sub-scanning direction. Assume that Nn emission points are arranged in the substantially main scanning direction and the distance between adjacent ones is indicated by Dn and Nm emission points are arranged in the sub-scanning direction and the distance between adjacent ones is indicated by Dm. The distance between emission points spaced farthest apart from each other in the main scanning direction is (Nn−1)× Dn=3Dn(Nn=4). The distance between emission points spaced farthest apart from each other in the sub-scanning direction is (Nm−1)×Dm=7Dm(Nm=8). As a result, 7Dm is larger than 3Dn. The pitch, i.e., distance between scanning lines on the scanned surface is |βm|×Dn/4. A desired pitch is difficult to be provided at the time of high density scanning. At 2400 dpi, for example, 25.4/2400=10.6 μm, while at 4800 dpi, 25.4 mm/4800=5.3 μm. |$\beta_m$|×Dn/Nn needs to be equal to such values. $\beta_m$ indicates the lateral magnification of the optical scanning device 100 in the main scanning direction.

Figure 16B:
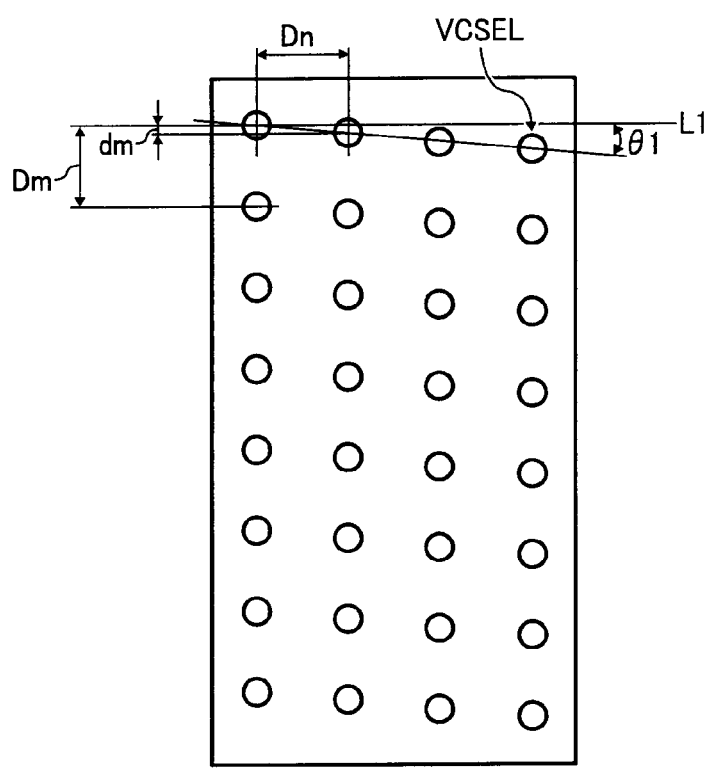

Means for solving the aforementioned problems is described below with reference to FIG. 16B. In the light source shown in FIG. 16B, emission points are arranged in a four-row, eight column matrix. The distance between emission points spaced farthest apart from each other in the main scanning direction is calculated as (Nn−1)×Dn=7Dn (Nn=8). The distance between emission points spaced farthest apart from each other in the sub-scanning direction is calculated as (Nm−1)×Dm=3Dm (Nm=4). The inequality 7Dn>3Dm is thus derived. The distance between emission points spaced farthest apart from each other in the main scanning direction is larger than the distance between emission points spaced farthest apart from each other in the sub-scanning direction. The pitch, i.e., distance between scanning lines on the scanned surface is calculated as |$\beta_m$|×Dn/7. A desired pitch is provided easily for high density scanning as compared to the conventional case. If the distance between emission points spaced farthest apart from each other in the main scanning direction is made to be larger than the distance between emission points spaced farthest apart from each other in the sub-scanning direction, the light source accepts high density scanning easily.

If the absolute value |$\beta_m$| of lateral magnification of the optical scanning device 100 in the sub-scanning direction is made to be smaller than the absolute value |$\beta_n$| of the lateral magnification in the main scanning direction, the pitch on the scanned surface is reduced and high density scanning is accepted easily. Although the distance between emission points spaced farthest apart from each other in the main scanning direction can be smaller than the distance between emission points spaced farthest away from each other in the sub-scanning direction to decrease |$\beta_m$|, various problems including a decrease in light use efficiency can arise.

According to the first embodiment, the emission points of the light source 10 are arranged at equal distances therebetween in the sub-scanning direction. Ten emission points are arranged in a direction parallel to the line L1, and four emission points are arranged in the sub-scanning direction. The emission points are thus arranged at equal distances therebetween in the sub-scanning direction. Further, the number of emission points arranged along the line L1 forming a predetermined angle with the main scanning direction is made to be larger than that of emission points arranged in a direction parallel to the sub-scanning direction. A desired beam pitch in the sub-scanning direction is obtained at the time of high density writing.

According to the first embodiment, the distance Dy between adjacent emission points in the main scanning direction (=30 μm) is larger than the distance Dz between emission points in the sub-scanning direction (=25 μm). As described above, how to reduce the distance between scanning lines on the scanned surface is a big challenge. Dz is made to be smaller than Dy and the distance between elements in the main scanning direction that does not affect high density writing in the sub-scanning direction is increased. The effect of thermal interference between elements is reduced and the space required for wirings to the elements is ensured.

According to the first embodiment, optical elements in the first optical system are provided as optical elements having a diffraction optical surface. Curvature of field caused by the temperature variation is reduced and the cost reduction of the optical elements is accomplished.

While the change in beam waist position (focal position) according to the temperature variation is reduced by the combination of diffraction optical effect and refraction effect, the following problems may arise. If a resin lens with aspherical surfaces is used for the optical element of the first optical system, when the temperature in the optical scanning device is increased, because of heat generation due to the rotation of a polygon scanner and the fixing unit in the image forming apparatus, the wavelength can be increased, the refractive index can be reduced, and the element can be expanded.

If a usual refracting surface is used, the beam waist position is changed in a direction away from the deflector (plus direction) because the wavelength becomes longer. As the wavelength becomes longer, though, the diffraction surface is changed so that the focal length is shortened. If the temperature increases, the diffraction surface is changed in a direction allowing shorter focal length (minus direction). Such change is offset by the change of the refracting surface, so that the focal length at the time of the temperature variation is reduced.

The following challenges can be provided when multiple beams pass through the diffraction surface.

(1) The difference in diffraction efficiency due to the difference in wavelength between the multiple beams (2) Maintaining the constant scanning line distance between the multiple beams (3) Reduced beam spot diameters in the multiple beams The difference in diffraction efficiency due to the difference in wavelength is improved if the number of the diffraction surfaces is as small as possible when the diffraction surface is designed at the first order. In view of stable beam waist position, for multiple beams, only one diffraction surface is preferably set in the first optical system. For example, if a plurality of semiconductor lasers with a center value of 780 nanometers are used, the specification of the semiconductor laser is usually 780−10/+15 nm. A difference of about 25 nanometers at a maximum can appear. If only one diffraction surface is provided, the difference in diffraction efficiency is 0.35% which is within an acceptable level for the optical scanning device accepting high image quality. If two diffraction surfaces are used, the difference in diffraction efficiency is 0.7%, which is disadvantageous for the optical scanning device accepting high image quality. In the case of multiple beams, to decrease the variation in the scanning line distance between multiple beams due to the difference in wavelength and to accomplish reduced beam spot diameter, only one diffraction surface is provided in the first optical system. While the case of using a resin lens as the scanning lens has been described, the present invention is applied to the case of using a glass lens for the optical element of the first optical system.

While the case of using the optical scanning device 100 in the monocolor image forming apparatus 200 has been described in the first embodiment, the image forming apparatus accepts color images and tandem color image forming apparatuses having a plurality of photosensitive drums can be used.

A multi-color image forming apparatus 1000A that accepts color images and has a plurality of photosensitive drums is described below with reference to FIGS. 17A and 17B. In the multi-color image forming apparatus 1000A, a plurality of scanned surfaces are scanned with and exposed to light so that images of the respective colors are visualized. The images are superimposed together and the resulting color image is outputted.

Figure 17A:
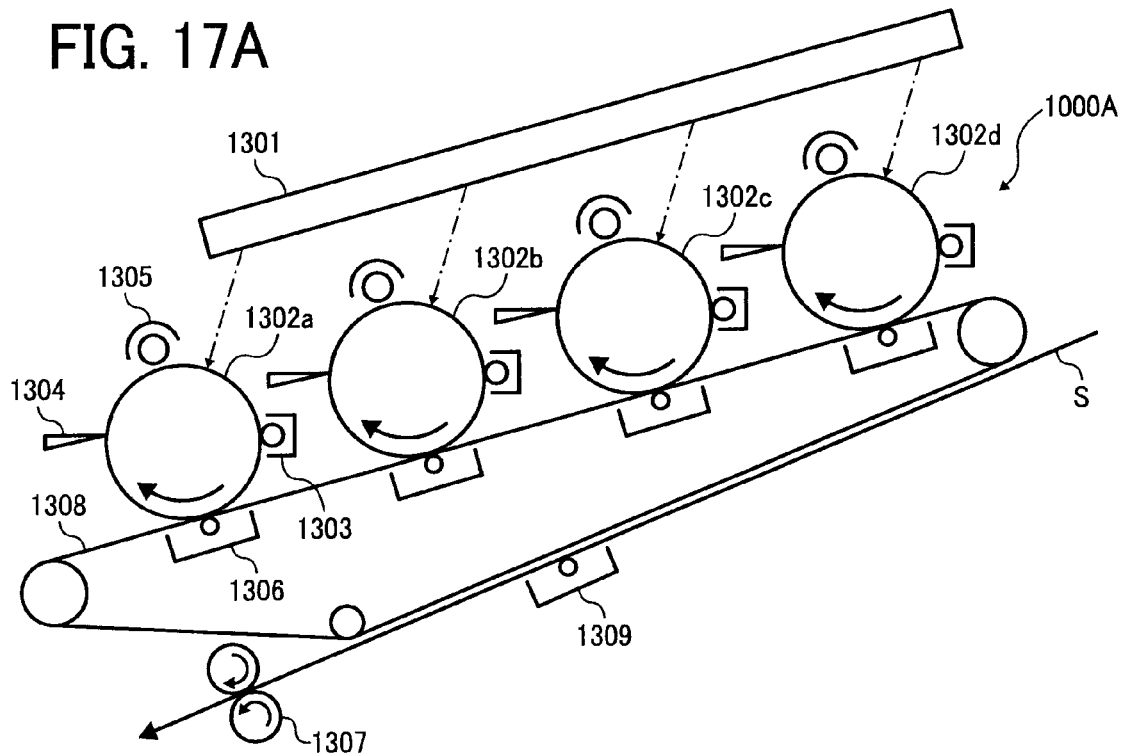
FIGS. 17A and 17B are schematic configuration diagrams of an image forming apparatus.
Figure 17B:
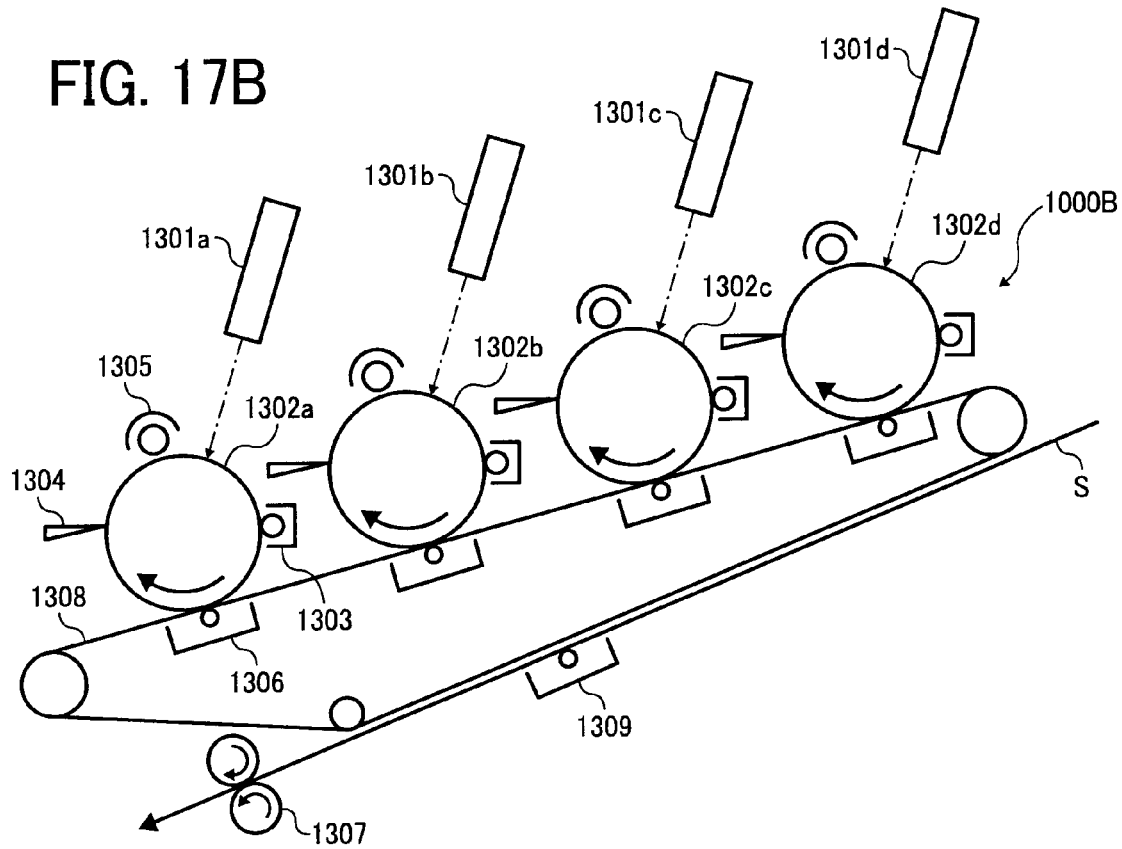

In the multi-color image forming apparatus 1000A, photosensitive drums 1302a to 1302d are rotated clockwise at a constant speed as indicated by the arrows in FIGS. 17A and 17B. The surfaces of the photosensitive drums 1302a to 1302d are charged uniformly by charging devices 1305. As in the image forming apparatus 200 described above, the surfaces of the photoconductors are scanned by an optical scanning device 1301. Scanning enables electrostatic latent images formed on the photosensitive drums 1302a to 1302d to be visualized as toner images by respective developing devices 1303. The toner images are transferred to an intermediate transfer belt 1308 by transfer units 1306 in a superimposed manner and fixed on a sheet S by a transfer unit 1309. A full-color image is thus formed.

Colors for the photosensitive drums 1302a to 1302d are cyan C, magenta M, yellow Y, and black K, and correspondences between the colors and the photosensitive drums 1302a to 1302d are freely selected and optimized. In this example, the photosensitive drum 1302a corresponds to the yellow Y, 1302b to the magenta M, 1302c to the cyan C, and 1302d to the black K. For optical scanning devices that handle regions where the scanning quality is difficult to be improved and that accept photoconductors whose adjustment steps want to be reduced, the corresponding colors should be selected according to the level of brightness and visibility. For example, yellow Y with low visibility and high brightness is desirably used for a photoconductor corresponding to an optical system with the worst optical characteristics (large curvature of field, large scanning line bending, or the like). If the durability of frequently used photoconductors is set to be high, for example, the photoconductor for black K is enlarged, the stability of the entire apparatus is improved. As a modification of the multi-color image forming apparatus 1000A, a plurality of optical scanning devices are used as in a multi-color image forming apparatus 1000B shown in FIG. 17B.

While the case of using the optical scanning device according to the present invention in printers has been described in the first embodiment, the optical scanning device is suitable for image forming apparatuses other than the printer such as copiers, facsimiles and complex machines having functions of copier and facsimile.

An optical scanning device according to a second embodiment of the present invention is described next. The optical scanning device of the second embodiment is basically the same as the optical scanning device 100 shown in FIG. 2.

The light source 10 includes a two dimensional array that, as shown in FIG. 3, 40 VCSELs (light emitting units) are formed on a substrate. Each light emitting unit is a VCSEL with an oscillation wavelength of 780 nanometers. The VCSEL has small variation in oscillation wavelength by temperatures and does not generate discontinuous changes in wavelength (so-called wavelength skip) in principle.

The divergence angle (FWHM) of a luminous flux outputted from the light source 10 is 7±1 degrees in a direction corresponding to the main scanning direction (hereinafter, "M direction") and a direction corresponding to the sub-scanning direction (hereinafter, "S direction"). The near-field pattern is formed in a circle with a diameter of 4 micrometers.

The 40 light emitting units are arranged two-dimensionally along a direction (L1) inclined from the M direction toward the S direction at an angle $\theta1$ and along the S direction, as shown in FIG. 3. In the light source 10, ten light emitting units are arranged along the L1 direction at equal distances therebetween and four light emitting units are arranged along the S direction at equal distances therebetween. The distance between two light emitting units at the opposite ends along the S direction is smaller than the distance between two light emitting units at the opposite ends along the M direction. The light emitting units are thus arranged in a parallelogram whose longer side is along the L1, shorter side the S direction. More light emitting units are arranged in the M direction than in the S direction.

In the two-dimensional array of VCSELs, the distance between two adjacent light emitting units needs to be large in view of prevention of heat generation and wirings. The distance dz between two adjacent light emitting units in the S direction is 1=dz<5 μm. The distance dm between light emitting units in the M direction becomes larger than dz. According to the second embodiment, for example, the writing density is 4800 dpi, Dy=30 μm, Dz=25 μm, and dz=2.5 μM. The distance between two light emitting units at the opposite ends in the M direction is calculated as Dy×9=270 μm, while the distance between two light emitting units at the opposite ends in the S direction dz×39=97.5 μm.

According to another example, in the two-dimensional array of VCSELs, the distance dz between two adjacent light emitting units in the S direction is determined to be 1=dz=4 μm. The distance dm between light emitting units in the M direction is larger than dz. According to the second embodiment, for example, the writing density is 4800 dpi, Dy=30 μm, Dz=20 μm, and dz=2.0 μm. The distance between two light emitting units at the opposite ends in the M direction is calculated as Dy×9=270 μm, while the distance between two light emitting units at the opposite ends in the S direction dz×39=78 μm.

To realize high density scanning, the distance between light emitting units in the S direction is desirably reduced. To improve the performance, manufacturing yield and lifetime of the two-dimensional array, the region where a plurality of light emitting units are arranged desirably expands wider along the M direction than in the S direction.

If a plurality of light emitting units are arranged over a region which is wider along the S direction, because of the deformation of the optical system and the change in optical characteristics by the temperature variation, the positions of light spots on the photosensitive drum shift in the sub-scanning direction (hereinafter, "sub-scanning direction shift"). The sub-scanning direction shift becomes wider as the light from the light source is away from the optical axis of the optical system in the sub-scanning direction.

The variation in the distance between scanning lines caused by the temperature variation becomes the largest between two light emitting units at the opposite ends in the S direction. Because the sub-scanning direction lateral magnification of the scanning optical system varies by its position in the main scanning direction, the scanning line of light from the light emitting unit on the +S side with respect to the optical axis of the scanning optical system bends in the opposite direction to that of the scanning line of light from the light emitting unit on the −S side with respect to the optical axis. An error in distance between scanning lines generated when the scanning lines bending in the opposite directions from each other are adjacent causes the sub-scanning direction shift and is perceived as banding appearing every scanning, resulting in a decrease in scanning accuracy (scanning quality).

Figure 18:
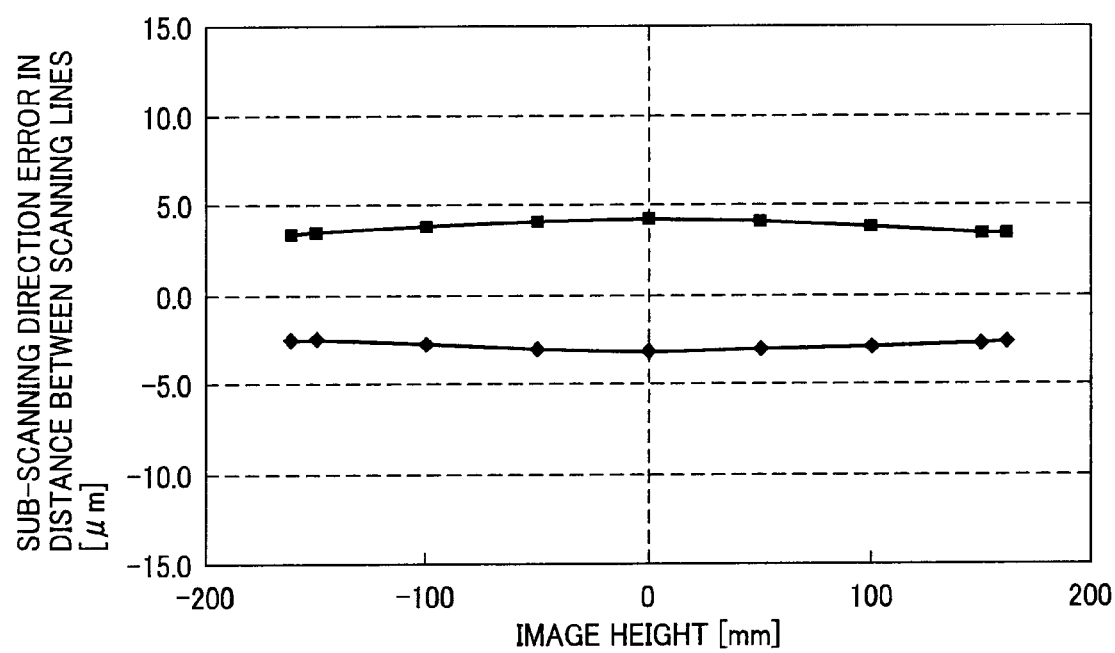
FIG. 18 is a graph for explaining a relationship between an image height and maximum amounts of plus and minus variations of the distance between scanning lines in the sub-scanning direction by temperatures.

When a resin lens is used for the scanning lens to reduce the cost of the apparatus, the sub-scanning direction shift becomes significant because the coefficient of thermal expansion and refractive index of the resin change greater by temperatures than those of glass. FIG. 18 depicts the relationship between the image height and the maximum amounts of plus and minus variations of the distance between scanning lines in the sub-scanning direction by temperatures, according to the second embodiment. The temperature variation of the distance between scanning lines is suppressed to be smaller than 5 micrometers and the influence on the deterioration in image quality is within the acceptable range. When the writing density is 4800 dpi, the resolution is 5.3 micrometers and variations larger than 5 micrometers cannot be accepted. The distance between two light emitting units at the opposite ends in the sub-scanning direction is desirably smaller than 100 micrometers.

Figure 19:
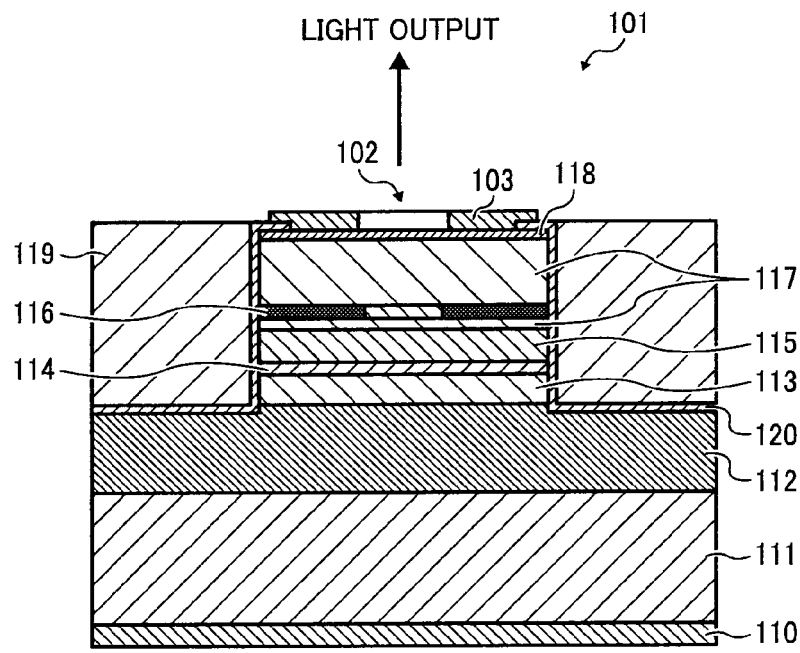
FIG. 19 is a schematic diagram for explaining each VCSEL in a two-dimensional array of VCSELs.
Figure 20:
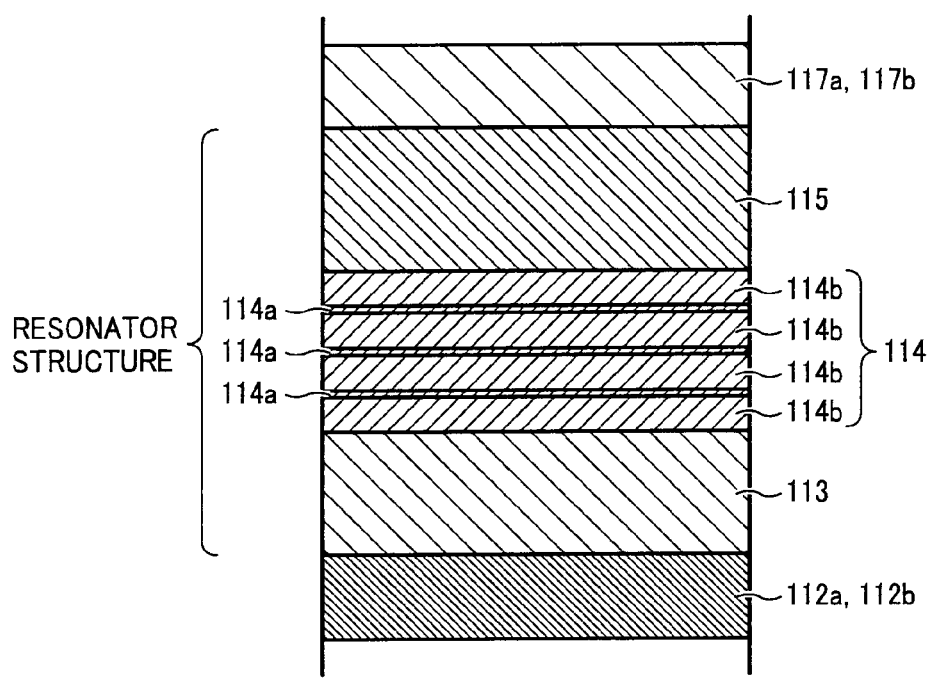
FIG. 20 is an enlarged view of a part of the VCSEL shown in FIG. 19.

In the respective light emitting units, as shown in, for example, FIG. 19, on an n-GaAs substrate 111, semiconductor layers including a lower reflecting mirror 112, a spacer layer 113, an active layer 114, a spacer layer 115, an upper reflecting mirror 117, and a p-contact layer 118 are successively laminated. A device made by laminating a plurality of semiconductor layers is called "laminated body" hereinafter for convenience. FIG. 20 is an enlarged view of the vicinity of the active layer 114.

The lower reflecting mirror 112 has 40.5 pairs of a low refractive index layer (low refractive index layer 112*a*) of n-$Al_{0.9}Ga_{0.1}As$ and high refractive index layer (high refractive index layer 112*b*) of n-$Al_{0.3}Ga_{0.7}As$. The optical thickness of each refractive index layer is set to be $\lambda/4$ where $\lambda$ indicates the oscillation wavelength. A graded composition layer (not shown) whose composition is changed gradually from one to another is provided between the low refractive index layer 112*a* and the high refractive index layer 112*b* to reduce the electrical resistance.

The spacer layer 113 is made of $Al_{0.6}Ga_{0.4}As$.

The active layer 114 includes a quantum well layer 114*a* made of $Al_{0.12}Ga_{0.88}As$ and a barrier layer 114*b* made of $Al_{0.3}Ga_{0.7}As$ (see FIG. 20).

The spacer layer 115 is made of $Al_{0.6}Ga_{0.4}As$.

The part includes the spacer layer 113, the active layer 114, and the spacer layer 115 is called a resonator structure and its thickness is set to be one wavelength optical thickness (see FIG. 20).

The upper reflecting mirror 117 has 24 pairs of a low refractive index layer (low refractive index layer 117*a*) of p-$Al_{0.9}Ga_{0.1}As$ and high refractive index layer (high refractive index layer 117*b*) of p-$Al_{0.3}Ga_{0.7}As$. The optical thickness of each refractive index layer is set to be $\lambda/4$. A graded composition layer (not shown) whose composition is changed gradually from one to another is provided between the low refractive index layer 117*a* and the high refractive index layer 117*b* to reduce the electrical resistance.

A selective oxidation layer 116 made of AlAs is placed in the upper reflecting mirror 117 to be spaced by $\lambda/4$ from the resonator structure.

The method for manufacturing the two-dimensional array (surface emitting semiconductor laser array) is described below in brief.

(1) The laminated body described above is formed by crystal growth utilizing metal organic chemical vapor deposition (MOCVD) or molecular beam epitaxy (MBE).

(2) Trenches are formed around a plurality of regions serving as light emitting units by dry etching, so that so-called mesa portions are formed. The etched bottom surface is set to reach the lower reflecting mirror 112. The etched bottom surface is preferably placed at least beyond the selective oxidation layer 116. The selective oxidation layer 116 thus appears at the sidewall of the trench. The size of the mesa portion (diameter) is preferably larger than 10 micrometers. If the mesa portion is formed too small, the element is filled with heat during its operation and the light emission characteristics can be affected adversely.

(3) The laminated body with the trench formed therein is thermally treated in vapor to selectively oxidize the circumference of the selective oxidation layer 116 in the mesa portion to change into an insulating layer of $Al_xO_y$. A non-oxidized AlAs region in the selective oxidation layer 116 remains at the central part of the mesa portion. A so-called current constriction structure limiting the path of drive current for the light emitting unit only to the central part of the mesa portion is thus provided.

(4) An $SiO_2$ protection layer 120 with a thickness of, for example, 150 nanometers is applied except for the region where an upper electrode 103 is formed and a light output unit 102 in the mesa portion. Polyimide 119 is embedded into the trenches to flatten them.

(5) The upper electrode 103 is formed on the p-contact layer 118 except for the light output unit 102 in the mesa portion and bonding pads (not shown) are formed around the laminated body. A wiring (not shown) for connecting the upper electrode 103 to the corresponding bonding pad is provided.

(6) A lower electrode (n-side common electrode) 110 is formed on the rear surface of the laminated body.

(7) The laminated body is cut into a plurality of chips.

Returning to FIG. 2, the coupling lens 11 is, for example, a glass lens with a focal length (F1) of 47.7 millimeters and forms light outputted from the light source 10 into substantially parallel light.

The focal length F1 is desirably as short as possible to prevent the apparatus from getting larger. If F1 is reduced, however, the lateral magnification of the optical system is increased and the beam spot diameter is difficult to be reduced. The range of F1 is thus constrained. For example, in an optical system accepting A3 sheets, F1 is desirably 25 to 48 millimeters. In an optical system accepting A4 sheets, F1 is desirably 18 to 34 millimeters.

The aperture member (aperture plate) 12 has, for example, a rectangular or ellipsoidal opening with a main scanning direction front width of 5.44 millimeters and sub-scanning direction front width of 2.10 millimeters, and determines the diameter of light beam through the coupling lens 11 in the main scanning direction and sub-scanning direction.

The linear image-forming lens 13 is, for example, a glass lens having a focal length (F2) of 107.0 millimeters and images, in the sub-scanning direction, the light that has passed through the opening of the aperture member (aperture plate) 12 near the deflecting and reflecting surface of the polygon mirror 15.

Because the beam waist position shifts largely by the temperature variation particularly in the sub-scanning direction, to reduce the beam spot diameter stably in the sub-scanning direction, the focal depth needs to be made deep. The numerical aperture of the optical system needs to be reduced not to narrow the beam excessively. To reduce the numerical aperture, the following methods are provided. (1) The opening diameter (aperture diameter) of the aperture member (aperture plate) 12 is reduced. (2) The focal length of the linear image-forming lens 13 is made long. Because the opening diameter is preferably as large as possible in view of the light use efficiency, the focal length of the linear image-forming lens 13 is preferably as long as possible.

The optical system placed in the optical path between the light source 10 and the polygon mirror 15 is also called a coupling optical system. According to the second embodiment, the coupling optical system includes the coupling lens 11, the aperture member (aperture plate) 12, and the linear image-forming lens 13.

For example, the polygon mirror 15 is a four-sided mirror whose inscribed circle has a radius of 7 millimeters and rotated at a constant speed around the axis parallel to the sub-scanning direction.

For example, the first scanning lens 16 is a resin lens having a central thickness (on the optical axis) of 13.5 millimeters. For example, the second scanning lens 17 is a resin lens having a central thickness (on the optical axis) of 3.5 millimeters. The detail configurations and characteristics of these lenses are the same as in the first embodiment.

The focal length of the scanning optical system in the main scanning direction is, for example, 237.8 millimeters, while the focal length in the sub-scanning direction is 71.4 millimeters, for example.

The sub-scanning direction lateral magnification (β2s) of the scanning optical system is, for example, 0.97. The sub-scanning direction lateral magnification (βs) of the entire optical system for the optical scanning device 100 is, for example, 2.18.

The sub-scanning direction lateral magnification (β2s) of the scanning optical system is, for example, 0.97. The sub-scanning direction lateral magnification (βs) of the entire optical system for an optical scanning device 900 is, for example, 2.6.

If the absolute value |β2s| of sub-scanning direction lateral magnification of the scanning optical system is large, the beam waist position shifts by manufacturing errors. The scanning optical system thus desirably has the equi-magnification or reduced magnification. If the reduced magnification is used, the following problem can arise. Diffracted light generated when beams are shaped by the aperture member (aperture plate) 12 reaches the photosensitive drum 201 and the beam spot size can be asymmetric in the defocus direction. The focal depth becomes shallow and the variation in beam spot diameter is increased. This occurs when the imaging position of the diffracted light is close to the photosensitive drum 201 and particularly significant when the scanning optical system has the equi-magnification or the reduced magnification.

Figure 21A:
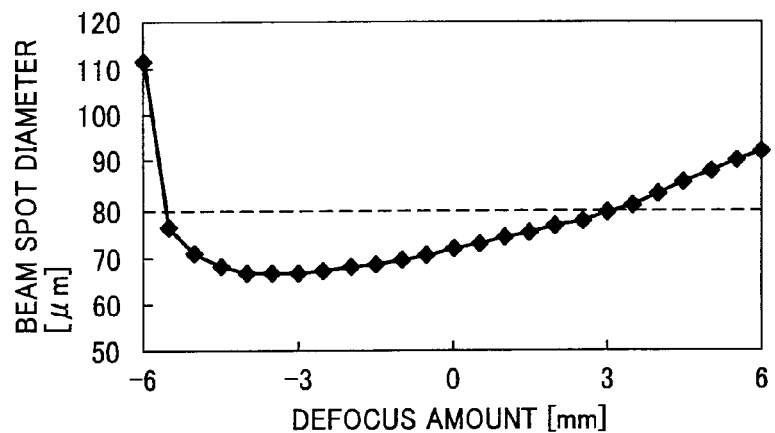
FIGS. 21A to 21C are graphs for explaining changes in a beam spot diameter with respect to a defocus amount in a sub-scanning direction when an imaging position of a diffracted light from aperture stop is different.
Figure 21B:
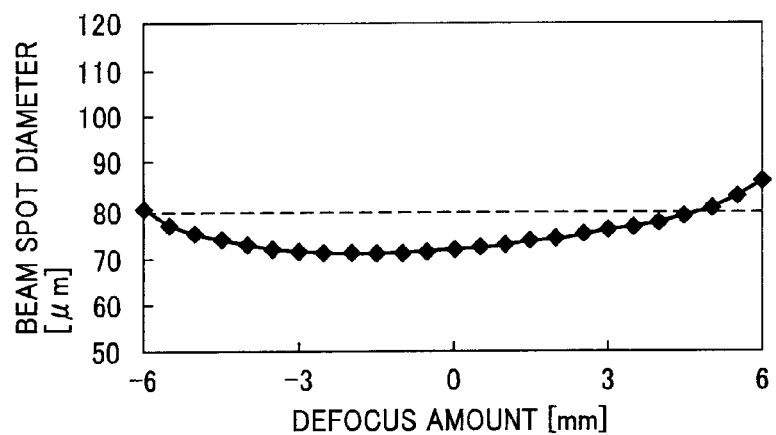
Figure 21C:
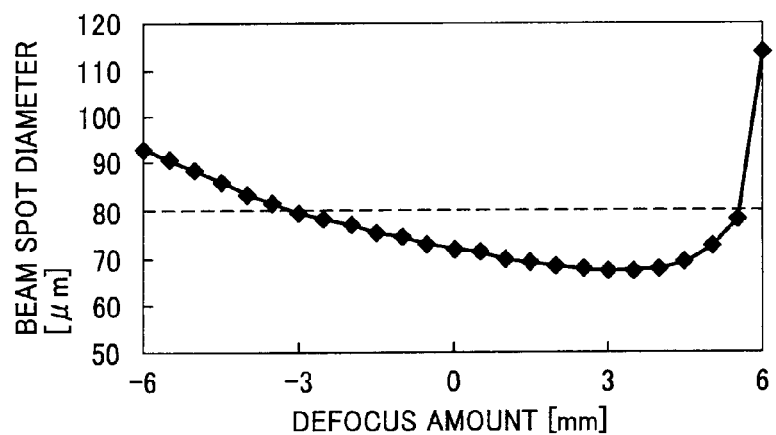

To describe the problem in detail, FIGS. 21A to 21C depict exemplary changes in the beam spot diameter along the sub-scanning direction with respect to the defocus amount in normal writing optical systems that have the substantially same configuration but are different from each other in the imaging position of diffracted light from the aperture stop. The horizontal axis indicates the defocus amount (millimeters), while the vertical axis the beam spot diameter (micrometers) in the sub-scanning direction. FIG. 21A depicts a case that the imaging position of the diffracted light is at −30 millimeters from the scanned surface. FIG. 21B depicts a case that the imaging position of the diffracted light is at −100 millimeters from the scanned surface. FIG. 21C depicts a case that the imaging position of the diffracted light is at +30 millimeters from the scanned surface. Referring to FIGS. 21A and 21C, the focal depth is drawn as an asymmetric curve due to the influence of the diffracted light and shallow. In FIG. 21B, because the imaging position of the diffracted light is farther away from the scanned surface as compared to FIGS. 21A and 21C, the curve is drawn more asymmetric with respect to the scanned surface and the focal depth is deep.

Figure 22A:
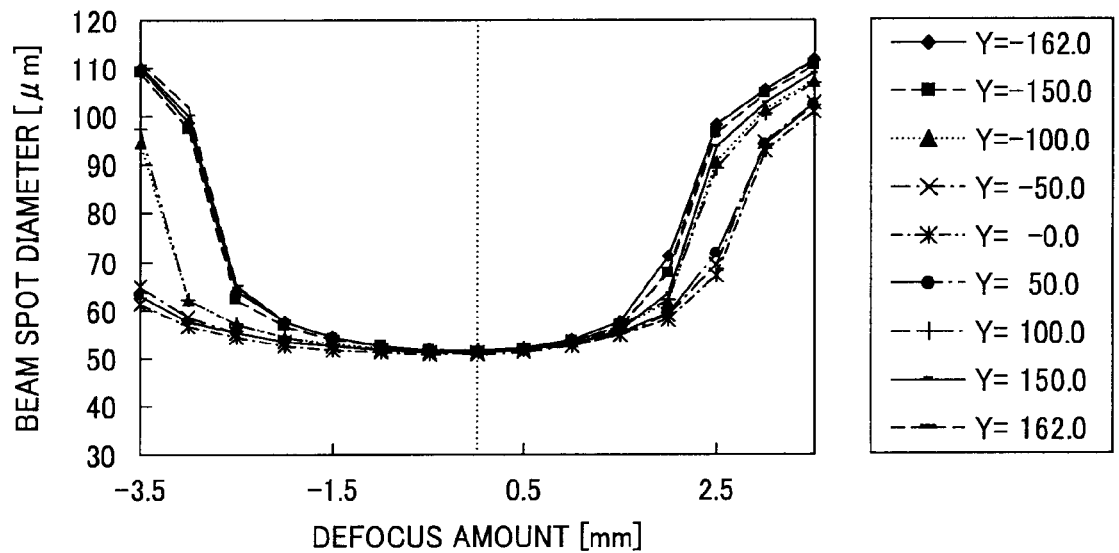
FIGS. 22A and 22B are graphs (1) for explaining relationships between a beam spot diameter and a defocus amount in a main scanning direction and sub-scanning direction.
Figure 22B:
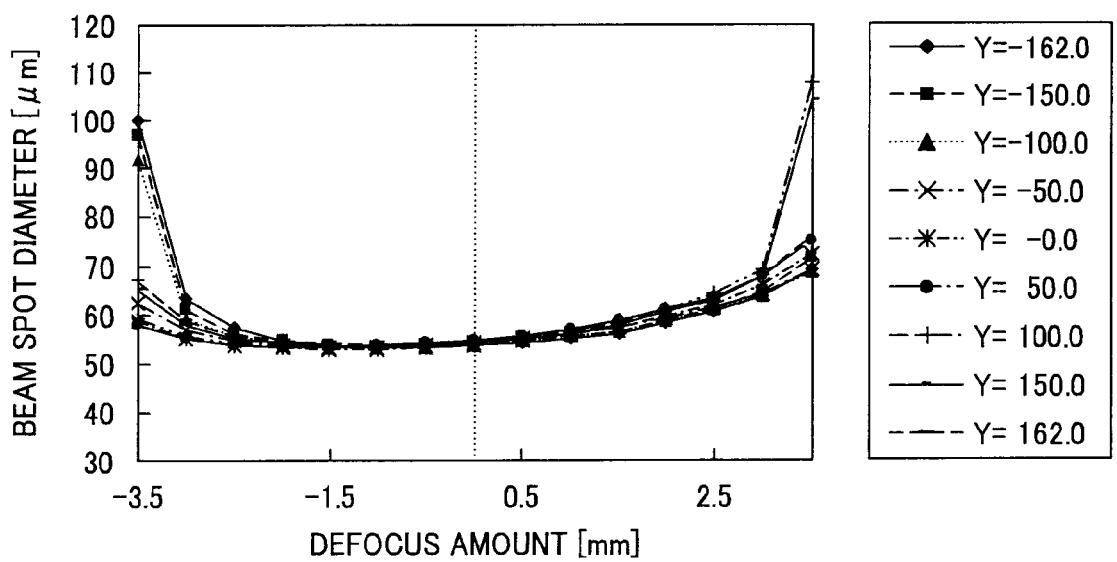

FIG. 22A depicts the relationship between the beam spot diameter and the defocus amount in the main scanning direction according to the second embodiment. FIG. 22B depicts the relationship between the beam spot diameter and the defocus amount in the sub-scanning direction.

According to the second embodiment, the imaging position of the diffracted light from the aperture member (aperture plate) 12 is at −42.5 millimeters from the scanned surface. The focal depth is drawn as an asymmetric curve and shallow. To reduce |β2s|, the scanning lens needs to be close to the scanned surface and the imaging position of the diffracted light is thus close to the scanned surface. Reducing |β2s| is not suitable for accomplishing high image quality because the influences of the temperature variation and manufacturing error are easily exerted as the variation in the beam spot diameter. In a multibeam optical system for realizing high speed, lights from a plurality of light emitting units spaced apart from each other in a direction corresponding to the main scanning direction pass through different positions on the scanning lens. The beam waist positions of all beams do not coincide with each other. As the focal depths of the lights become shallower, the problem about stable beam spot diameters becomes serious. |β2s| thus cannot be made small. If |β2s| is increased, the variation in refractive power of the optical system by the temperature variation becomes large and the variation in the beam waist position along the sub-scanning direction becomes large, resulting in an increase in variation of the beam spot diameter. In the second embodiment, |β2s|=0.97.

In view of the aforementioned optical constraints, according to the second embodiment, the sub-scanning direction lateral magnification βs of the entire optical system is calculated as βs=F2/F1×|β2s|=2.18. If βs is made to be different from the value of the second embodiment, F1 needs to be smaller and F2 and |β2s| larger to accomplish high image quality and high speed. βs is the same as in the second embodiment or larger. βs is desirably 2.1 or larger.

Figure 23A:
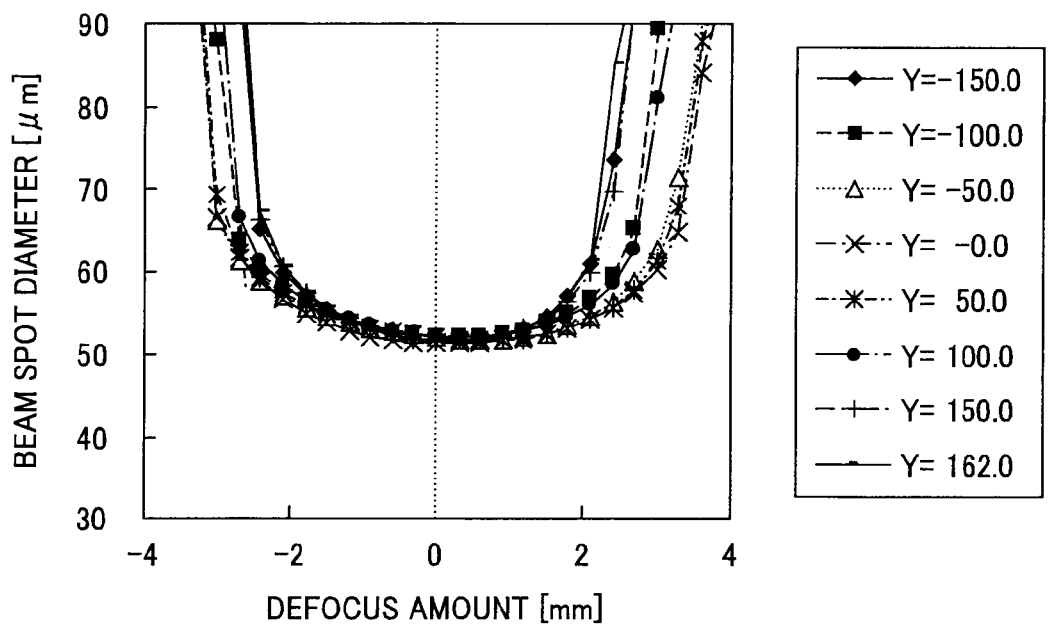
FIGS. 23A and 23B are graphs (2) for explaining relationships between a beam spot diameter and a defocus amount in a main scanning direction and sub-scanning direction.
Figure 23B:
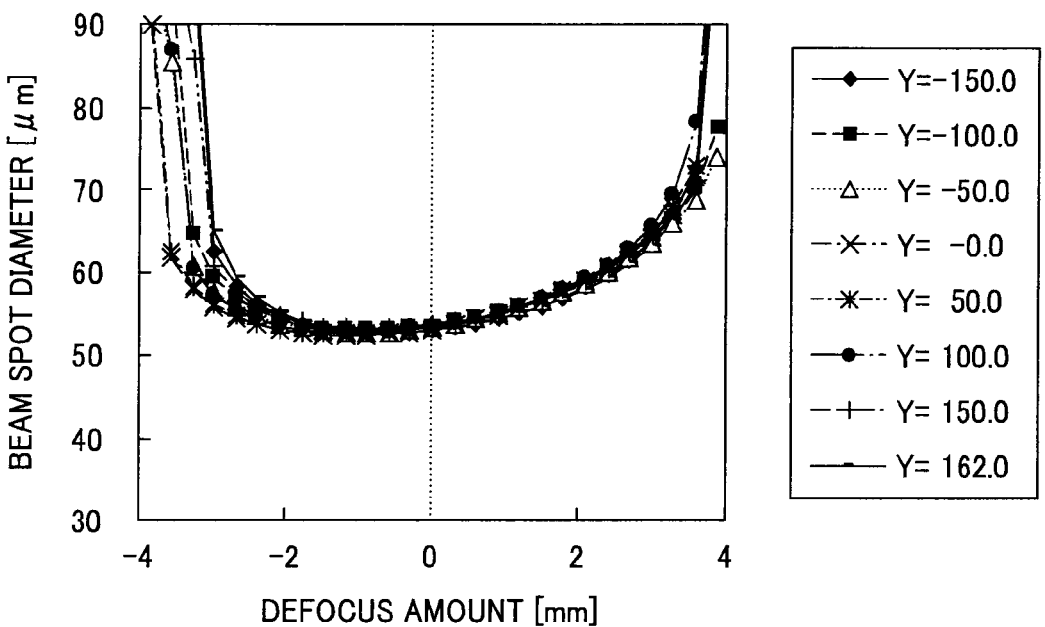

FIG. 23A depicts, as another example, the relationship between the beam spot diameter and the defocus amount in the main scanning direction according to the second embodiment. FIG. 23B depicts the relationship between the beam spot diameter and the defocus amount in the sub-scanning direction.

According to the second embodiment, the imaging position of the diffracted light from the aperture member (aperture plate) 12 is at −44.5 millimeters from the scanned surface. The focal depth is drawn as an asymmetric curve and shallow. To reduce |β2s|, the scanning lens needs to be close to the scanned surface and the imaging position of the diffracted light is thus close to the scanned surface. Reducing |β2s| is not suitable for accomplishing high image quality because the influences of the temperature variation and manufacturing error are easily exerted as the variation in the beam spot diameter. In the multibeam optical system for realizing high speed, lights from a plurality of light emitting units spaced apart from each other in a direction corresponding to the main scanning direction pass through different positions on the scanning lens. The beam waist positions of all beams do not coincide with each other. The focal depths of the lights become shallower and the problem about stable beam spot diameters becomes serious. |β2s| thus cannot be reduced. If |β2s| is increased, the variation in refractive power of the optical system by the temperature variation becomes large and the variation in the beam waist position along the sub-scanning direction also becomes large, resulting in an increase in variation of the beam spot diameter. In the second embodiment, |β2s|=0.97.

In view of the aforementioned optical constraints, according to the second embodiment, the sub-scanning direction lateral magnification βs of the entire optical system is calculated as $\beta s = F2/F1 \times |\beta 2s| = 2.65$. If $\beta s$ is different from the value of the second embodiment, F1 needs to be smaller and F2 and $|\beta 2s|$ larger to realize high image quality and high speed. $\beta s$ is the same as in the second embodiment or larger. $\beta s$ is desirably 2.5 or larger.

If the distance dz between light emitting units in the two-dimensional array is smaller than 1 micrometer (lower limit value), the sub-scanning direction lateral magnification of the writing optical system is increased and the variation in distance between light emitting units in the light source is widened to be reflected on the scanned surface, so that the variation in distance between scanning lines becomes large. To realize high accuracy optical scanning, the two-dimensional array with reduced variation in distance between light emitting units is required. (1) Because the distance between light emitting units cannot be extended, wiring is so difficult that high accuracy is required. (2) As the distance between light emitting units gets smaller, the radiation performance decreases. Heat generated from the element during its driving cannot be neglected and the element is deteriorated more quickly, resulting in cost increases.

If the distance between light emitting units in a direction corresponding to the main scanning direction is extended to handle radiation while dz is maintained lower than the lower limit value, the light emitting units are spaced farther away, so that the variations in distance between scanning lines and in the beam spot diameter become large. The optical performance is thus deteriorated. As a result, dz is desirably larger than 1 micrometer.

For conventional writing densities, i.e., 300 dpi, 600 dpi, and 1200 dpi, diagonal lines on images, namely lines that are neither parallel to the main scanning direction nor sub-scanning direction are not smooth and perceived as jaggies. For 2400 dpi that higher density is realized and jaggies are hard to be perceived, the distance between scanning lines is $25.4/2400 = 10.58$ µm. The distance dz between light emitting units satisfying the value is calculated as $10.58/2.18 = 4.9$ µm when the sub-scanning direction lateral magnification $\beta s$ of the entire optical system is 2.18. For 4800 dpi realizing higher density, dz is calculated as $25.4/4800/2.18 = 2.5$ µm. When the distance dz between light emitting units is smaller than 5 micrometers, high density is realized, the beam spot diameter is stabilized, superior light use efficiency is accomplished, and the optical scanning is performed at sufficient light exposure. If the distance dz between light emitting units is larger than 5 micrometers, however, it is not desirable because the lack of light exposure can occur and the beam spot diameter can be unstable. If the distance dz between light emitting units falls below 1 micrometer, the lifetime of the apparatus can be shortened and the distance between scanning lines can be destabilized.

For 2400 dpi that higher density is realized and jaggies are hard to be perceived, the distance between scanning lines is calculated as $25.4/2400 = 10.58$ µm. The distance dz between light emitting units satisfying the value is $10.58/2.65 = 4.0$ µm when the sub-scanning direction lateral magnification $\beta s$ of the entire optical system is 2.18. For 4800 dpi realizing higher high density, dz is calculated as $25.4/4800/2.65 = 2.0$ µm. If the distance dz between light emitting units is made to be equal to or smaller than 4 micrometers, high density is realized, the beam spot diameter is stabilized, superior light use efficiency is accomplished, and the optical scanning is performed at sufficient light exposure. If the distance dz between light emitting units excesses 4 micrometers, however, it is not desirable because the lack of light exposure may occur and the beam spot diameter may be destabilized. If the distance dz between light emitting units falls below 1 micrometer, the lifetime of the apparatus can be shortened and the scanning line distance can be destabilized.

According to the second embodiment, the target beam spot diameter for a light spot formed on the surface of the photosensitive drum 201 is 52 micrometers in the main scanning direction and 55 micrometers in the sub-scanning direction.

Exemplary specific values of the symbols d1 to d11 shown in FIG. 2 are listed in Table 2.

The length of the effective scanning area (main scanning direction writing width) on the photosensitive drum 201 is 323 millimeters (161.5 millimeters). The image height is thus −161.5 millimeters to +161.5 millimeters.

Figure 24A:
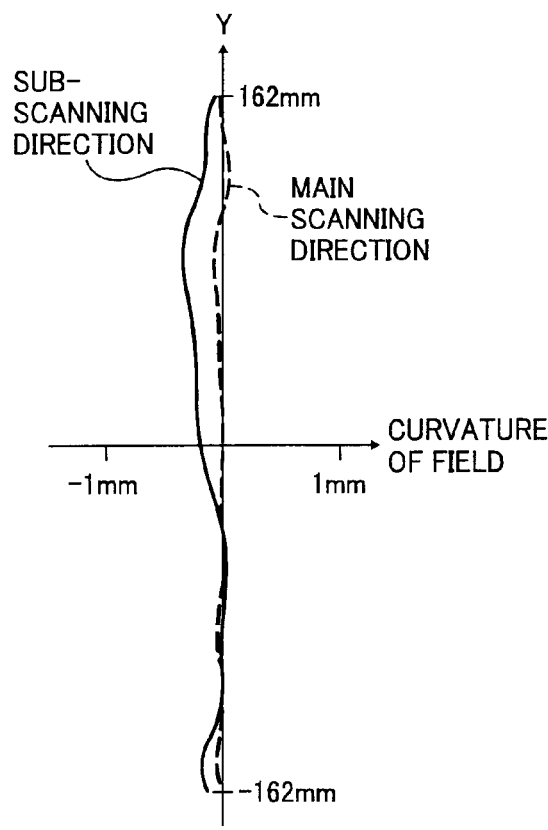
FIGS. 24A and 24B are graphs for explaining a curvature of field and linearity, respectively.
Figure 24B:
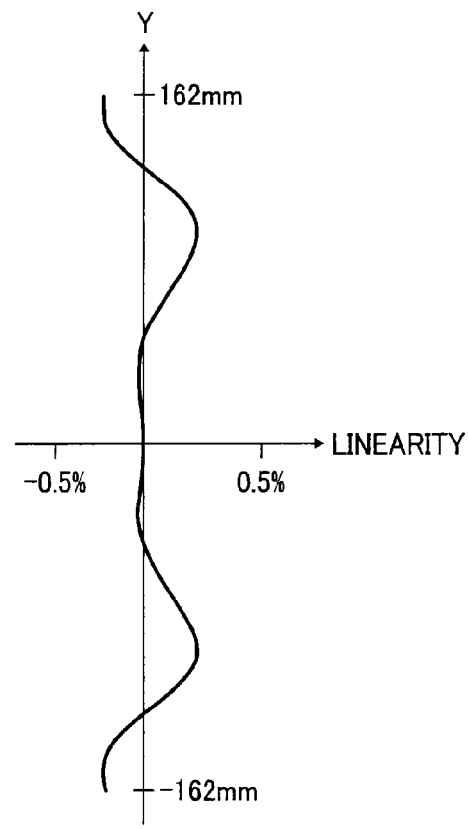

FIG. 24A depicts exemplary measured values of the curvature of field according to the second embodiment. FIG. 24B depicts exemplary measured values of the constant speed characteristic according to the second embodiment. From these graphs, it is found that image planes are aligned excellently along the sub-scanning direction and the variation in the beam spot diameter is significantly small in spite of the thickness of the scanning lens being reduced compared to conventional cases.

Figure 25:
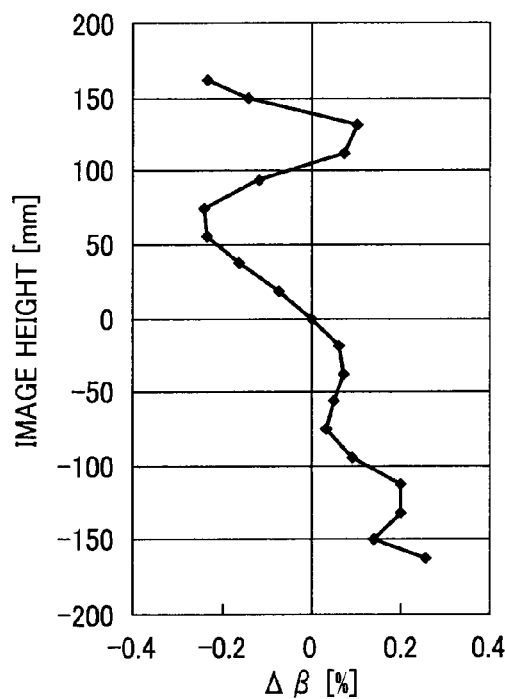
FIG. 25 is a graph for explaining deviation of sub-scanning direction lateral magnification.

FIG. 25 depicts exemplary deviation ($\Delta \beta$) of the sub-scanning direction lateral magnification according to the second embodiment. The difference between the maximum value of the sub-scanning direction lateral magnification and the minimum value is suppressed at about 0.5% and the lateral magnification is considered to be substantially constant. In FIG. 25, the sub-scanning direction lateral magnification when the image height is zero (the center of the effective scanning area (see FIG. 3)) is determined as the reference ($\Delta \beta = 0$).

The relationship between the magnification of the optical system, the near-field pattern of the light emitting unit, and the beam spot diameter according to the second embodiment is as described above.

According to the second embodiment, in the main scanning direction, k is calculated as $5.0 \times 4.50 = 0.4$ or as $5.1 \times 4 \div 50 = 0.41$. d is suppressed at about 4%. The beam spot diameter in the main scanning direction is 52 micrometers and varies little. In the sub-scanning direction, k is 0.16, the beam spot diameter does not vary at all, and is still 55 micrometers when $\omega_0 = 55$ µm.

According to the conventional case, the lateral magnification in the main scanning direction is 8.9, k is 0.712, and $\omega = 56$ µm which is 10% or more increase. If the near-field pattern is enlarged, for example, A=7 µm, at 5 of the lateral magnification and 50 micrometers of the target beam spot diameter, k is 0.7 and $\omega = 56$ µm, which is not desirable for high image quality. If k is 0.65 (for example, $\beta = 5$, A=6.5, $\omega_0 = 50$), $\omega$ is 55 micrometers which is about 10% variation. The deterioration in image quality is thus within the acceptable range.

It is thus desirable that at least $k = \beta A/\omega_0 < 0.7$. The actual relationship between the beam spot diameter and $\omega$ is expressed by Equation (8) from Equation (7).

VCSEL is known to be advantageous for outputs when the near-field pattern is larger. By setting so that Equation (4) is satisfied, the beam spot diameter is reduced using VCSEL which is advantageous in the amount of light.

As described above, the optical scanning device 100 according to the second embodiment includes the light source 10 having 40 light emitting units arranged two-dimensionally, the polygon mirror 15 for deflecting the light from the light source 10, and the scanning optical system for collecting the light deflected by the polygon mirror 15 onto the photosensitive drum 201. With respect to the plurality of light emitting units, the distance dz between two light emitting units that are the most adjacent in the S direction corresponding to the sub-scanning direction is 2.5 micrometers. Even if an inexpensive scanning optical system is used, the variation in the spot diameter of a light spot on the photosensitive drum 201 is reduced. The scanned surface is optically scanned with high accuracy without increasing costs.

To increase the writing density in the sub-scanning direction using the multibeam light source, two methods are provided, i.e., (1) reducing the sub-scanning direction lateral magnification of the optical system, and (2) reducing the distance between light emitting units in the sub-scanning direction. However, according to the method (1), in the aperture plate determining the beam diameter on the scanned surface, the sub-scanning direction width of the opening needs to be made narrow, resulting in the lack of amount of light. Meanwhile, in the method (2), the thermal interference between the light emitting units can impact and the space required for making the wirings from the light emitting units pass through is difficult to be ensured.

According to the second embodiment, a plurality of light emitting units are arranged two-dimensionally and the distance between two light emitting units at the opposite ends in a direction corresponding to the main scanning direction is larger than the distance between two light emitting units at the opposite ends in a direction corresponding to the sub-scanning direction. While the influence of the thermal interference between the light emitting units is reduced and the space required for making the wirings of the light emitting units pass through is ensured, the distance between light emitting units in the sub-scanning direction is reduced.

The laser printer 200 according to the second embodiment includes the optical scanning device 900 that can scan the photosensitive drum 201 with light accurately without increasing costs. Images with high quality are thus formed at high speed without increasing costs.

While the case that the light source 10 includes 40 light emitting units formed on the same substrate has been described in the second embodiment, the present invention is not limited thereto. As shown in FIG. 6, for example, the light source 10 can have 20 light emitting units on the same substrate. In the light source 10, ten light emitting units are arranged along the M direction at equal distances therebetween, two light emitting units are arranged along the S direction. The distance between two light emitting units at the opposite ends in the S direction is smaller than the distance between two light emitting units at the opposite ends in the M direction.

The writing density is 2400 dpi, Dy=25 μm, Dz=49 μm, and dz=4.9 μm. The distance between two light emitting units at the opposite ends in the M direction is calculated as Dy×9=225 μm, while the distance between two light emitting units at the opposite ends in the S direction dz×19=93.1 μm.

Figure 26:
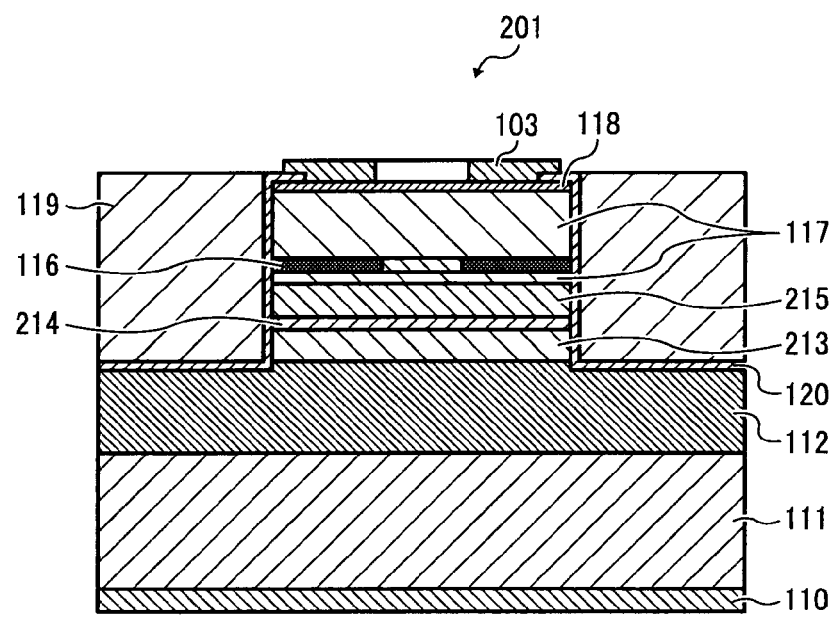
FIG. 26 is a schematic diagram for explaining a modification of VCSEL.
Figure 27:
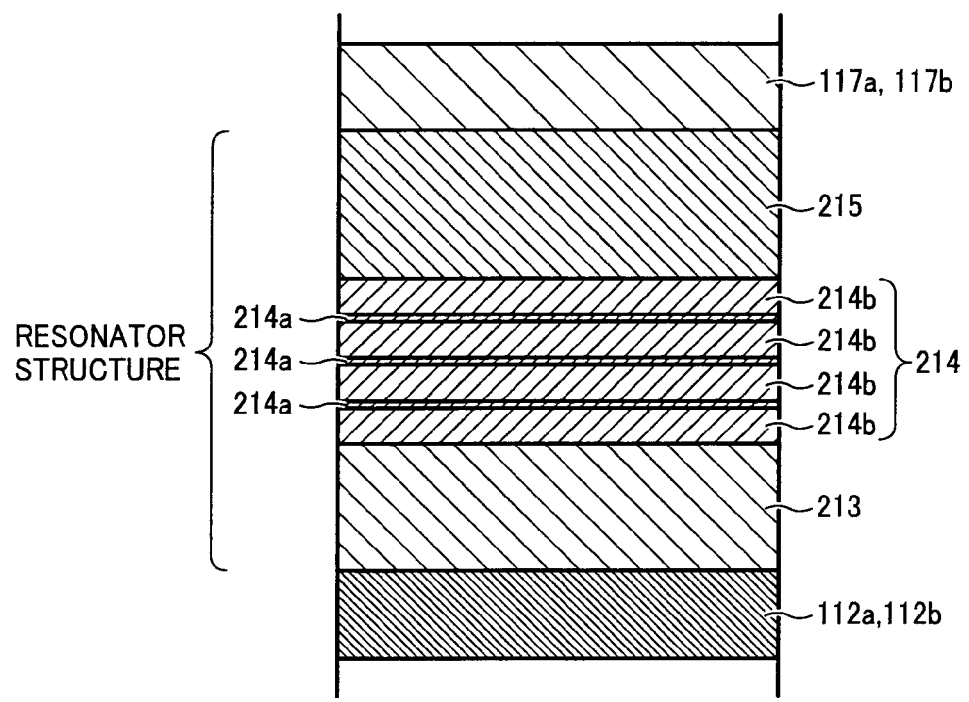
FIG. 27 is an enlarged view of a part of the VCSEL shown in FIG. 26.

In the second embodiment, as shown in FIGS. 26 and 27 and Table 3 as an example, instead of the two-dimensional array 10', a two-dimensional array that materials for some semiconductor layers of the plurality of semiconductor layers in the two-dimensional array 10' are changed can be used.

TABLE 3

| | | WAVELENGTH BAND | | |
|---|---|---|---|---|
| | | 780 nm | 780 nm | 850 nm(Ref.) |
| MATERIALS FOR SPACER LAYER/ QUANTUM WELL LAYER | | AlGaAs/AlGaAs | AlGaInP/GaInPAs | AlGaAs/AlGaAs |
| | SPACER LAYER | $Al_{0.6}Ga_{0.4}As$ (Eg = 2.0226 eV) | $(Al_xGa_{1-x})_{0.5}In_{0.5}P$ (Eg(x = 0.7) = 2.324 eV) | $Al_{0.6}Ga_{0.4}As$ (Eg = 2.0226 eV) |
| ACTIVE LAYER | QUANTUM WELL LAYER | $Al_{0.12}Ga_{0.88}As$ (Eg = 1.5567 eV) | GaInPAs (COMPRESSIVE STRAIN) (Eg = 1.5567 eV) | GaAs (Eg = 1.42 eV) |
| | BARRIER LAYER | $Al_{0.3}Ga_{0.7}As$ (Eg = 1.78552 eV) | $Ga_xIn_{1-x}P$ (TENSILE STRAIN) (Eg(x = 0.6) = 2.02 eV) | $Al_{0.3}Ga_{0.7}As$ (Eg = 1.78552 eV) |
| DIFFERENCE IN Eg BETWEEN SPACER LAYER AND QUANTUM WELL LAYER Δ(Eg) | | 465.9 meV | 767.3 meV | 602.6 meV |
| DIFFERENCE IN Eg BETWEEN BARRIER LAYER AND QUANTUM WELL LAYER Δ(Eg) | | 228.8 meV | 463.3 meV | 365.5 meV |

The two-dimensional array is obtained by changing the spacer layer 113 of the two-dimensional array 101 to a spacer layer 2131, the active layer 114 to an active layer 214, and the spacer layer 115 to a spacer layer 2151.

The spacer layer 213' is made of $(Al_{0.7}Ga_{0.3})0.5In_{0.5}P$ serving as a wide band gap.

The active layer 214 includes, as shown in FIG. 27, three GaInPAs quantum well layers 214a each of which has a band gap wavelength of 780 nanometers and makes compressive strain remain in its composition and four $Ga_{0.6}In_{0.4}P$ barrier layers 214b that lattice-match with the three layers and are subjected to tensile strain.

The spacer layer 215' is made of $(Al_{0.7}Ga_{0.3})_{0.5}In_{0.5}P$ serving as the wide band gap.

The part includes the spacer layer 213', the active layer 214, and the spacer layer 215' is called a resonator structure and its thickness is set to be one wavelength optical thickness (see FIG. 27).

Because the two-dimensional array uses AlGaInP materials for the spacer layer, the difference in band gap between the spacer layer and the active layer is significantly larger as compared to the two-dimensional array 10' in the first embodiment.

Table 3 lists the differences in band gap between the spacer layer and the quantum well layer and between the barrier layer and the quantum well layer in traditional material compositions for VCSEL whose materials for spacer layer/quantum well layer are AlGaAs/AlGaAs and wavelength is 780 nm band (hereinafter, "VCSEL_A" for convenience), VCSEL whose materials for spacer layer/quantum well layer are AlGaInP/GaInPAs and wavelength is 780 nm band (hereinafter, "VCSEL_B" for convenience), and VCSEL whose materials for spacer layer/quantum well layer are AlGaAs/GaAs and wavelength is 850 nm band (hereinafter, "VCSEL_C" for convenience). VCSEL_A corresponds to a VCSEL 101 in the two-dimensional array 100', while VCSEL_B (x=0.7) the VCSEL (hereinafter, VCSEL 201') in the two-dimensional array 200'.

As seen from Table 3, the difference in band gap of VCSEL_B is larger than VCSEL_A and even VCSEL_C.

Specifically, the difference in band gap between the spacer layer and the quantum well layer in VCSEL_B is 767.3 mega-electron volts (meV) which is extremely larger than 465.9 meV for VCSEL_A. The difference in band gap between the barrier layer and the quantum well layer for VCSEL_B is excellent, allowing superior carrier confinement.

Because the quantum well layer is subjected to compressive strain in the VCSEL 201', the gain is increased due to the band separation of heavy holes and light holes to be high. High outputs are thus realized low thresholds. The reflectance of a reflecting mirror on the light extraction side (upper reflecting mirror 117) is reduced and further higher outputs are realized. Moreover, higher gains suppress decreases in light outputs due to temperature increases and the distance between VCSELs in the two-dimensional array is further reduced.

Because the quantum well layer 214a and barrier layer 214b are made of materials not containing aluminum (Al) in the VCSEL 201', the amount of oxygen taken into the active layer 214 is reduced. As a result, a non-radiative recombination center is thus prevented and further longer lifetime is realized.

When the two-dimensional array of VCSELs is used for a so-called optical writing unit, if the lifetime of VCSELs is short, the writing optical unit is disposable. Because the VCSEL 201' has long lifetime as described above, the optical writing unit utilizing the two-dimensional array 200' is reused. Resource conservation is promoted and reduction of environmental burdens is realized. These advantages are applied to other apparatuses utilizing the two-dimensional array of VCSELs.

While the case that laser light with a wavelength of 780 nm band is outputted from the light emitting units has been described in the second embodiment, the present invention is not limited thereto, and any wavelength corresponding to the sensitivity characteristic of the photosensitive drum 201 can be used. At least a part of materials for making the light emitting units or at least a part of the configurations of the light emitting units is changed according to the oscillation wavelength.

In the second embodiment, if a large temperature variation is expected a diffraction lattice can be formed on at least one surface of the scanning optical system for correcting the influence of the temperature variation.

While the case of using glass lenses for the coupling lens 11 and the linear image-forming lens 13 has been described in the second embodiment, at least one of them can be a resin lens for cost reduction. In this case, if a large temperature variation is expected, a diffraction optical element can be used instead of the resin lens.

While the second embodiment has described the case that the scanning optical system includes two scanning lenses, the present invention is not limited thereto, and the scanning optical system can include three or more scanning lenses.

While the second embodiment has described the laser printer 200 as the image forming apparatus, the present invention is not limited thereto. Any image forming apparatus with the optical scanning device 900 can form high quality images at high speed without increasing costs.

Also in image forming apparatuses for making multicolor images, by utilizing optical scanning devices accepting color images, high quality images can be formed at high speed without increasing costs.

Figure 28:
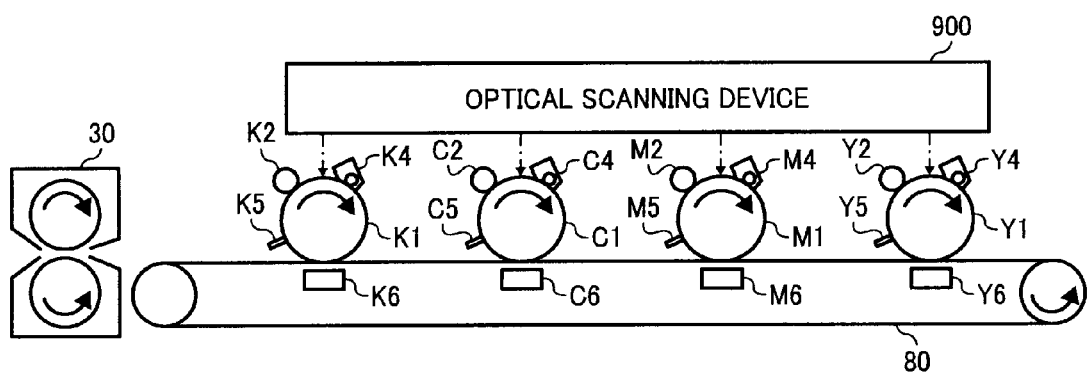
FIG. 28 is a schematic diagram for explaining a tandem color copier.

For example, as shown in FIG. 28, a tandem color copier that accepts color images and has a plurality of photosensitive drums can be used. The tandem color copier includes a photosensitive drum K1, a charger K2, a developer K4, a cleaning unit K5, and a charging unit K6 for transfer that are for black (K), a photosensitive drum C1, a charger C2, a developer C4, a cleaning unit C5, and a charging unit C6 for transfer that are for cyan (C), a photosensitive drum M1, a charger M2, a developer M4, a cleaning unit M5, and a charging unit M6 for transfer that are for magenta (M), a photosensitive drum Y1, a charger Y2, a developer Y4, a cleaning unit Y5, and a charging unit Y6 for transfer that are for yellow (Y), the optical scanning device 900, a transfer belt 80, and a fixing unit 30.

In the optical scanning device 900, a plurality of light emitting units in the light source 10 are divided into those for black, cyan, magenta, and yellow. The light from the light emitting units for black is irradiated via the scanning optical system for black on the photosensitive drum K1. The light from the light emitting units for cyan is irradiated via the scanning optical system for cyan on the photosensitive drum C1. The light from the light emitting units for magenta is irradiated via the scanning optical system for magenta on the photosensitive drum M1. The light from the light emitting units for yellow is irradiated via the scanning optical system for yellow on the photosensitive drum Y1.

The photosensitive drums are rotated in the arrows shown in FIG. 28. The charger, developer, charging unit for transfer, and cleaning unit are placed in this order around each of the photosensitive drums. The chargers charge the surfaces of the corresponding photosensitive drums uniformly. Light is irradiated on the surfaces of the photosensitive drums charged by the chargers from the optical scanning device 900, so that electrostatic latent images are formed on the respective photosensitive drums. Toner images are then formed on the surfaces of the photosensitive drums by the corresponding developers. The respective color toner images are transferred to a recording sheet by the corresponding charging units for transfer and fixed on the recording sheet by the fixing unit 30.

Figure 29:
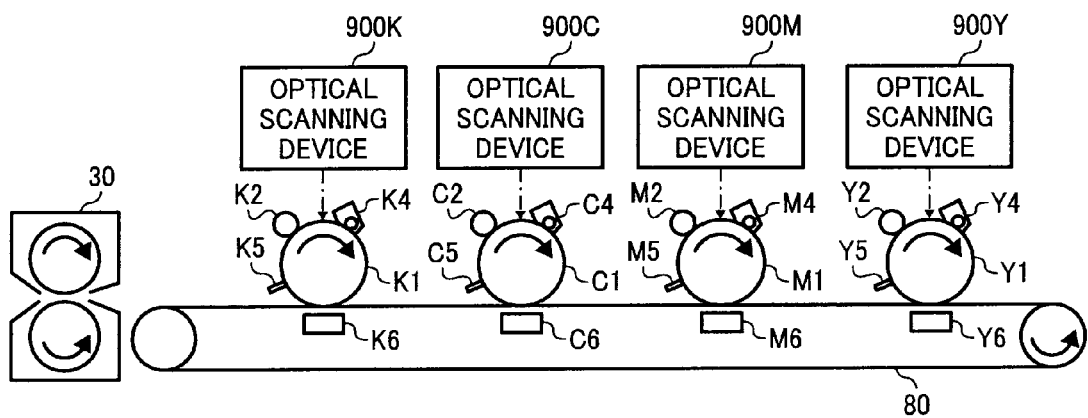
FIG. 29 is a schematic diagram for explaining another tandem color copier.

In the tandem color copier, as shown in FIG. 29, an optical scanning device 900K for black, an optical scanning device 900C for cyan, an optical scanning device 900M for magenta, and an optical scanning device 900Y for yellow can be used instead of the optical scanning device 900.

As described above, the optical scanning device according to an aspect of the present invention is suitable for scanning the scanned surface with light accurately without increasing costs. The image forming apparatus according to the present invention is suitable for forming high quality images without increasing costs.

Accordingly, by setting the elements within the range that the aforementioned condition is satisfied, for example, so that the size of the rotating polygon mirror is minimized, the rotating polygon mirror is made compact while the eclipse of light beams in the main scanning direction is prevented. The cost reduction of the apparatus is thus realized. The compact rotating polygon mirror reduces the consumption energy and the amount of heat generated in its drive system. Degradation in various optical characteristics including an increase in spot diameter of the light beam by temperature variation, uneven scanning pitch, and sub-scanning direction variation in beam pitch are suppressed. Even if the rotating polygon mirror has a conventional size, the angle of view at the time of scanning the scanned surface is increased. The path of the light beam behind the rotating polygon mirror is shortened, so that the compactness and cost reduction of the optical scanning device are realized.

Accordingly, the distance between, among the plurality of light emitting units, two light emitting units that are the most adjacent to each other in a direction corresponding to the sub-scanning direction is larger than 1 micrometer and smaller than 5 micrometers. Even if inexpensive scanning optical systems are utilized, variation in spot diameter of a light spot on the scanned surface is reduced. As a result, the scanned surface can be scanned accurately with light without increasing costs.

Accordingly, the image forming apparatus includes the optical scanning device according to the present invention. Therefore, the image forming apparatus can form images accurately on a recording medium while accomplishing its cost reduction.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical scanning device that scans a writing area on a scan-target surface with a plurality of light beams in a main scanning direction, the optical scanning device comprising:
   a light source including a plurality of light emission outlets arranged two-dimensionally;
   a first optical system including a coupling lens for coupling the light beams output from the light emission outlets;
   an aperture member having an opening and placed at or near a focal position of the coupling lens;
   a rotating polygon mirror including a plurality of deflecting surfaces, each of the deflecting surfaces deflecting light beams that have passed through the opening in the aperture member; and
   a second optical system that collects the light beams deflected by the rotating polygon mirror on the writing area on the scan-target surface, wherein
   W is a distance between, among the light emission outlets, light emission outlets spaced farthest apart from each other in the main scanning direction, E is a dimension of the opening of the aperture in the main scanning direction, Rc is a radius of a circle inscribing the rotating polygon mirror, M is a number of deflecting surfaces of the rotating polygon mirror, α is an angle of incidence of the light beams on the deflecting surfaces, φ is an angle of view of the second optical system from start to end of scanning on the writing area, x is a distance between the aperture member and the rotating polygon mirror, $f_1$ is a focal length of the coupling lens, and $$2Rc \times \tan\left(\frac{\pi}{M}\right) \times \cos\left(\frac{\alpha + \varphi/4}{2}\right) - E - W \times \frac{x}{f_1} - Rc \times \sin\frac{\phi}{2}\cos\frac{\alpha}{2} > 0.$$

2. The optical scanning device according to claim 1, wherein
   the light source is a vertical resonator surface emitting laser,
   A is a dimension of a near-field pattern of an arbitrary one of the light emission outlets in one of the main scanning direction and a sub-scanning direction perpendicular to the main scanning direction, β is a lateral magnification of an optical system including the first optical system and the second optical system, ω is a spot diameter of the light beam, and $$\left\{\left(\frac{\omega}{\beta \cdot A}\right)^2 - \frac{1}{2}\right\}^{-\frac{1}{2}} < 0.7.$$

3. The optical scanning device according to claim 1, wherein a distance between the light emission outlets spaced farthest apart from each other in the main scanning direction is larger than a distance between light emission outlets spaced farthest apart from each other in a sub-scanning direction perpendicular to the main scanning direction, and
   a lateral magnification of an optical system including the first optical system and the second optical system in the main scanning direction is larger than a lateral magnification of the optical system in the sub-scanning direction.

4. The optical scanning device according to claim 3, wherein the light emission outlets are arranged along a first direction that makes a predetermined angle with the main scanning direction and along a second direction that is parallel to the sub-scanning direction to be placed equidistant in the sub-scanning direction, and
   a number of light emission outlets arranged in the first direction is larger than a number of light emission outlets arranged in the second direction.

5. The optical scanning device according to claim 4, wherein the light emission outlets are arranged along the first direction at a first pitch and are arranged along the second direction at a second pitch that is smaller than the first pitch.

6. The optical scanning device according to claim 1, wherein the first optical system includes an optical element with a diffraction optical surface.

7. An image forming apparatus, comprising:
   at least one image carrier; and
   the optical scanning device according to claim 1 configured to scan the image carrier with light and including image information.

8. The image forming apparatus according to claim 7, wherein the image information is multicolor image information.

9. An optical scanning device for scanning a scan-target surface with light, the optical scanning device comprising:
   a light source including a plurality of light emitting units arranged two-dimensionally;
   a deflector that deflects light beams output from the light emitting units of the light source; and
   a scanning optical system that collects the light beams deflected by the deflector on the scan-target surface, wherein
   a distance between two light emitting units that are closest to each other in a sub-scanning direction is larger than 1 micrometer and smaller than 5 micrometers.

10. The optical scanning device according to claim 9, wherein a distance between two light emitting units furthest away from each other in the sub-scanning direction is smaller than a distance between two light emitting units furthest away from each other in a main scanning direction perpendicular to the sub-scanning direction.

11. The optical scanning device according to claim 9, wherein
   the scanning optical system includes at least one resin lens, and
   a distance between two light emitting units furthest away from each other in the sub-scanning direction is smaller than 100 micrometers.

12. The optical scanning device according to claim 9, wherein the light emitting units are vertical resonator surface emitting lasers, and in at least one of the sub-scanning direction and a main scanning direction perpendicular to the sub-scanning direction, the light emitting units satisfy $$\left\{\left(\frac{\omega}{\beta \cdot A}\right)^2 - \frac{1}{2}\right\}^{-\frac{1}{2}} < 0.7,$$

where A is a dimension of near-field pattern of a light beam output from an arbitrary one of the light emitting units, β is a lateral magnification of an entire optical system including the scanning optical system, and ω is a spot diameter of the light beam on the scan-target surface.

13. The optical scanning device according to claim 9, wherein a lateral magnification in the sub-scanning direction of an entire optical system including the scanning optical system is equal to or larger than 2.1.

14. The optical scanning device according to claim 9, wherein an absolute value of a lateral magnification in the sub-scanning direction of the scanning optical system is about 1.

15. An image forming apparatus, comprising:
 at least one image carrier; and
 the optical scanning device according to claim 9 configured to scan the image carrier with light and including image information.

16. The image forming apparatus according to claim 15, wherein the image information is multicolor image information.

17. An optical scanning device, comprising:
 a plurality of light emitting units, wherein
 a distance between two adjacent light emitting units in a sub-scanning direction is equal to or larger than 1 micrometer and smaller than 4 micrometers.

18. The optical scanning device according to claim 17, further comprising:
 an optical system, wherein
 a lateral magnification in a sub-scanning direction of the optical system is equal to or larger than 2.5.

19. An image forming apparatus comprising the optical scanning device according to claim 17.

20. The optical scanning device according to claim 9, wherein the light source comprises a vertical resonator surface emitting laser array.

* * * * *